(12) United States Patent
Richardson et al.

(10) Patent No.: US 12,368,439 B2
(45) Date of Patent: Jul. 22, 2025

(54) CAPACITIVE BATCH COUNTING TO SUPPORT ONE-WAY TIME-OF-FLIGHT OR OTHER OPERATIONS

(71) Applicant: Raytheon Company, Waltham, MA (US)

(72) Inventors: James J. Richardson, Temecula, CA (US); David D. Crouch, Farragut, TN (US); Spencer A. Miller, Dallas, TX (US); Taylor B. Boultinghouse, Addison, TX (US)

(73) Assignee: Raytheon Company, Arlington, VA (US)

( * ) Notice: Subject to any disclaimer, the term of this patent is extended or adjusted under 35 U.S.C. 154(b) by 207 days.

(21) Appl. No.: 18/347,244

(22) Filed: Jul. 5, 2023

(65) Prior Publication Data
US 2025/0015805 A1    Jan. 9, 2025

(51) Int. Cl.
| | | |
|---|---|---|
| *H03K 21/00* | (2006.01) | |
| *H03K 5/24* | (2006.01) | |
| *G01S 11/08* | (2006.01) | |
| *G01S 11/12* | (2006.01) | |

(52) U.S. Cl.
CPC .............. *H03K 21/00* (2013.01); *H03K 5/24* (2013.01); *G01S 11/08* (2013.01); *G01S 11/12* (2013.01)

(58) Field of Classification Search
None
See application file for complete search history.

(56) References Cited

U.S. PATENT DOCUMENTS

| | | |
|---|---|---|
| 9,705,561 B2 | 7/2017 | Henry et al. |
| 9,787,412 B2 | 10/2017 | Henry et al. |
| 9,793,955 B2 | 10/2017 | Henry et al. |
| 9,800,327 B2 | 10/2017 | Gerszberg et al. |
| 9,831,912 B2 | 11/2017 | Henry et al. |
| 9,860,075 B1 | 1/2018 | Gerszberg et al. |
| 9,866,309 B2 | 1/2018 | Bennett et al. |

(Continued)

FOREIGN PATENT DOCUMENTS

| | | |
|---|---|---|
| CN | 110868212 B | 3/2023 |
| EP | 3419325 B1 | 11/2020 |

OTHER PUBLICATIONS

Burr-Brown Corporation, "Low Noise, Dual Switched Integrator," ACF2101, Sep. 1994, 19 pages.

(Continued)

*Primary Examiner* — Cassandra F Cox

(57) ABSTRACT

A method includes receiving electromagnetic signals containing pulses. The method also includes converting the pulses contained in the electromagnetic signals into an electrical signal that identifies at least some of leading or trailing edges of the pulses. The method further includes repeatedly (i) accumulating the electrical signal to generate a voltage using an integrating circuit and (ii) resetting the integrating circuit in response to the voltage of the integrating circuit meeting or exceeding a threshold voltage. In addition, the method includes providing a count value identifying a number of times that the voltage of the integrating circuit meets or exceeds the threshold voltage. Each time the voltage of the integrating circuit meets or exceeds the threshold voltage is representative of a specific number of pulses received in the electromagnetic signals.

20 Claims, 12 Drawing Sheets

(56) References Cited

U.S. PATENT DOCUMENTS

| | | | |
|---|---|---|---|
| 9,876,264 | B2 | 1/2018 | Barnickel et al. |
| 9,893,795 | B1 | 2/2018 | Henry et al. |
| 9,904,535 | B2 | 2/2018 | Gross et al. |
| 9,913,139 | B2 | 3/2018 | Gross et al. |
| 9,935,703 | B2 | 4/2018 | Bennett et al. |
| 9,967,173 | B2 | 5/2018 | Gross et al. |
| 9,973,940 | B1 | 5/2018 | Rappaport |
| 9,999,038 | B2 | 6/2018 | Barzegar et al. |
| 10,020,844 | B2 | 7/2018 | Bogdan et al. |
| 10,027,397 | B2 | 7/2018 | Kim |
| 10,090,594 | B2 | 10/2018 | Henry et al. |
| 10,168,695 | B2 | 1/2019 | Barnickel et al. |
| 10,178,445 | B2 | 1/2019 | Lubranski et al. |
| 10,928,483 | B1 | 2/2021 | Heinen et al. |
| 11,719,782 | B2 | 8/2023 | Heinen et al. |
| 11,933,645 | B2 * | 3/2024 | Ji .................... G01D 5/2403 |
| 2006/0155508 | A1 | 7/2006 | Choi |
| 2009/0231958 | A1 | 9/2009 | Wei et al. |
| 2011/0026363 | A1 | 2/2011 | Lavache |
| 2014/0160880 | A1 | 6/2014 | King et al. |
| 2015/0247916 | A1 | 9/2015 | Bartov et al. |
| 2017/0361726 | A1 | 12/2017 | Widmer et al. |
| 2018/0156616 | A1 | 6/2018 | Bennett et al. |
| 2018/0219869 | A1 | 8/2018 | Kumar et al. |
| 2018/0239008 | A1 | 8/2018 | Han et al. |
| 2019/0170785 | A1 | 6/2019 | Riccardi et al. |
| 2019/0181532 | A1 | 6/2019 | Vannucci et al. |
| 2023/0199677 | A1 | 6/2023 | Richardson et al. |

OTHER PUBLICATIONS

Atherton, "The Army wants drones that make their own networks," Sightline Media Group, Jan. 2019, 4 pages.

"CyPhy Works aims to bring drones to agriculture, mining, public safety sectors," Boston Business Journal, Oct. 2015, 3 pages.

Guillen-Perez et al., "Flying Ad Hoc Networks: A New Domain for Network Communications," Sensors 2018, Sep. 2018, 23 pages.

"Scholar: Ranging & Localization," Humatics, Data Sheet, Mar. 2019, 1 page.

McNeil, "CyPhy Works' new drone takes off on Kickstarter," Directions Media, Jun. 2015, 3 pages.

Nandakumar et al., "3D Localization for Sub-Centimeter Sized Devices," Association for Computing Machinery, SenSys '18, Nov. 2018, 12 pages.

"UWB localization techniques—TOF and TDOA," Nanjing Woxu Wireless Co., Ltd., Apr. 2019, 3 pages.

"Ultra wideband (UWB) wireless AD hoc networks," Nanjing Woxu Wireless Co., Ltd., Apr. 2019, 3 pages.

"PARC: The Tethered Drone," Aria Insights, Specification Sheet, Version PN15534-01/D, Jan. 2019, 2 pages.

Riley, "A High-Resolution Time Interval Counter Using the TAPR TADD-2 and TICC Modules," Hamilton Technical Services, Mar. 2017, 9 pages.

"PulsON 440 Data Sheet / User Guide," Time Domain, 320-0317D, May 2017, 78 pages.

"PulsON 440 Operation Description / Theory of Operation," Time Domain, Dec. 2015, 9 pages.

"Intelligent Transportation based UWB Positioning and Connectivity," University at Albany—SUNY, Signals & Networks Lab, Apr. 2018, 34 pages.

Yavuz et al., "A new multi-tier adaptive military MANET security protocol using hybrid cryptography and signcryption," Turk J. Elec. Eng. & Comp. Sci., vol. 18, No. 1, 2010, 21 pages.

Office Action dated Apr. 17, 2020 in connection with U.S. Appl. No. 16/525,294, 15 pages.

International Search Report and Written Opinion of the International Searching Authority dated May 26, 2020 in connection with International Patent Application No. PCT/US2020/022978, 15 pages.

Office Action dated Jul. 2, 2020 in connection with U.S. Appl. No. 16/525,294, 10 pages.

Shi et al., "Design on Hybrid RFID & Ultrasound Based 2D Indoor Positioning System," Thesis, Department of Electrical Engineering, Blekinge Institute of Technology, 2013, 62 pages.

Applicant-Initiated Interview Summary dated Jul. 8, 2022 in connection with U.S. Appl. No. 16/525,221, 4 pages.

Office Action dated May 6, 2022 in connection with U.S. Appl. No. 16/525,221, 13 pages.

* cited by examiner

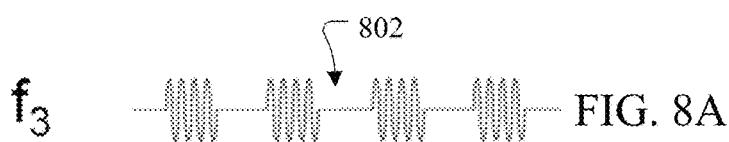
FIG. 8A
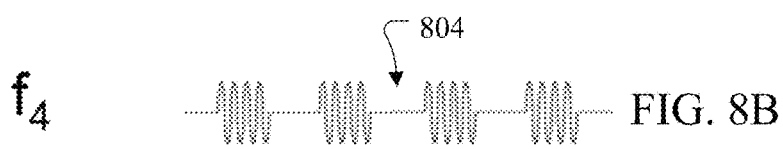
FIG. 8B
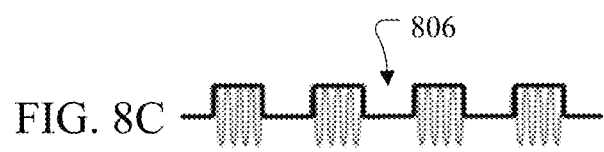
FIG. 8C
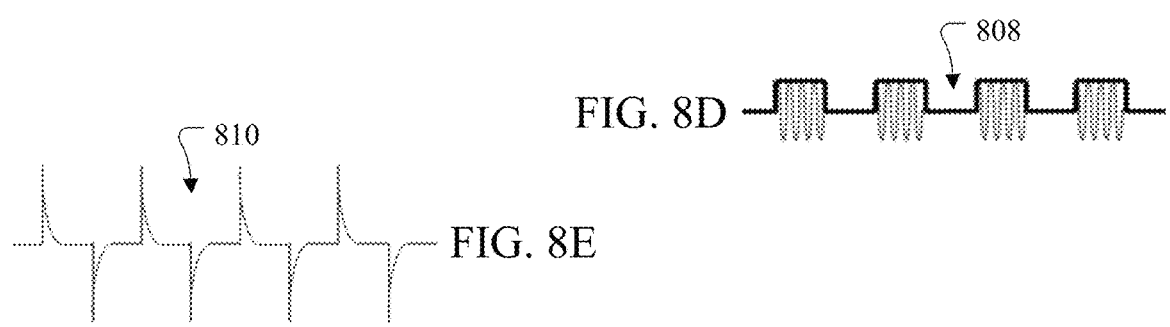
FIG. 8D
FIG. 8E
FIG. 8F
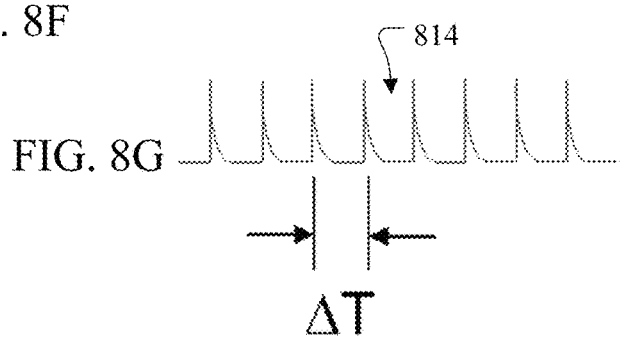
FIG. 8G
$\Delta T$
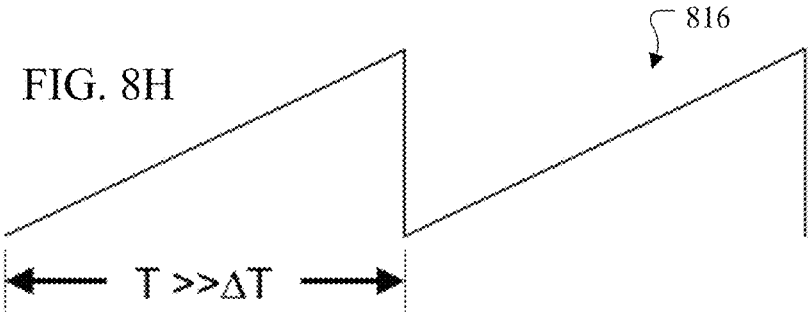
FIG. 8H
$T \gg \Delta T$

CAPACITIVE BATCH COUNTING TO SUPPORT ONE-WAY TIME-OF-FLIGHT OR OTHER OPERATIONS

TECHNICAL FIELD

This disclosure generally relates to counting systems. More specifically, this disclosure relates to capacitive batch counting to support one-way time-of-flight or other operations.

BACKGROUND

A mobile ad hoc network or "MANET" generally refers to a communication network in which autonomous nodes communicate wirelessly and are often able to move independently. There is typically no previously-defined infrastructure or architecture for a mobile ad hoc network. As a result, the nodes in the network can often arrange and re-arrange themselves in various ways, and the arrangement of the nodes typically varies over time.

SUMMARY

This disclosure provides capacitive batch counting to support one-way time-of-flight or other operations.

In a first embodiment, a method includes receiving electromagnetic signals containing pulses. The method also includes converting the pulses contained in the electromagnetic signals into an electrical signal that identifies at least some of leading or trailing edges of the pulses. The method further includes repeatedly (i) accumulating the electrical signal to generate a voltage using an integrating circuit and (ii) resetting the integrating circuit in response to the voltage of the integrating circuit meeting or exceeding a threshold voltage. In addition, the method includes providing a count value identifying a number of times that the voltage of the integrating circuit meets or exceeds the threshold voltage. Each time the voltage of the integrating circuit meets or exceeds the threshold voltage is representative of a specific number of pulses received in the electromagnetic signals.

In a second embodiment, an apparatus includes a front-end configured to convert pulses contained in received electromagnetic signals into an electrical signal that identifies at least some of leading or trailing edges of the pulses. The apparatus also includes an integrating circuit configured to repeatedly (i) accumulate the electrical signal to generate a voltage and (ii) be reset in response to the voltage of the integrating circuit meeting or exceeding a threshold voltage. The apparatus further includes a counter configured to generate a count value identifying a number of times that the voltage of the integrating circuit meets or exceeds the threshold voltage. Each time the voltage of the integrating circuit meets or exceeds the threshold voltage is representative of a specific number of pulses received in the electromagnetic signals.

In a third embodiment, an apparatus includes a first node configured to transmit first electromagnetic signals to a second node and receive second electromagnetic signals from the second node. The first node includes a front-end configured to convert pulses contained in the second electromagnetic signals into an electrical signal that identifies at least some of leading or trailing edges of the pulses. The first node also includes an integrating circuit configured to repeatedly (i) accumulate the electrical signal to generate a voltage and (ii) be reset in response to the voltage of the integrating circuit meeting or exceeding a threshold voltage. The first node further includes a counter configured to generate a count value identifying a number of times that the voltage of the integrating circuit meets or exceeds the threshold voltage. Each time the voltage of the integrating circuit meets or exceeds the threshold voltage is representative of a specific number of pulses received in the electromagnetic signals.

Other technical features may be readily apparent to one skilled in the art from the following figures, descriptions, and claims.

BRIEF DESCRIPTION OF THE DRAWINGS

For a more complete understanding of this disclosure, reference is made to the following description, taken in conjunction with the accompanying drawings, in which:

FIGS. 8A through 8H illustrate other example signals associated with a capacitive batch counter in accordance with this disclosure;

DETAILED DESCRIPTION

Figure 1:
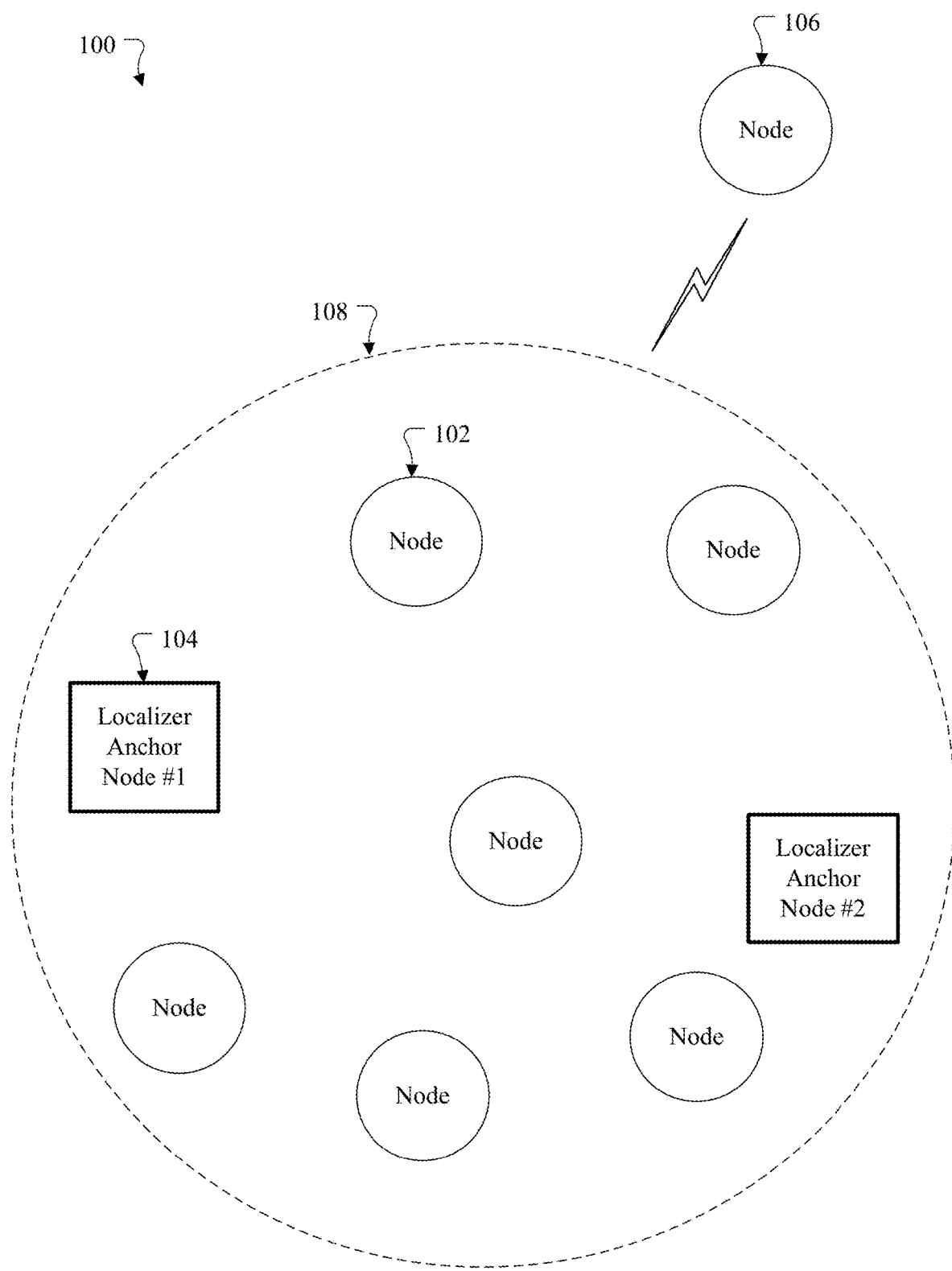
FIG. 1 illustrates an example system supporting time-of-flight localization for mobile ad hoc networks in accordance with this disclosure.

FIGS. 1 through 15, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, a mobile ad hoc network (MANET) refers to a communication network in which autonomous nodes communicate wirelessly and are often able to move independently, so the arrangement of the nodes typically varies over time. In some cases, it may be necessary or desirable to operate the nodes in a mobile ad hoc network as a coherent distributed array, which means that the operations of the nodes are coherently coordinated so that the nodes perform specific operations as a single system. The ability to operate nodes in a mobile ad hoc network coherently can provide various advantages depending on the implementation and application. For example, operating the nodes in a mobile ad hoc network coherently may allow the nodes to collectively create a high-gain synthetic aperture directional antenna.

The formation of a coherent distributed but mobile array of nodes often requires both localization of the nodes and timing synchronization of the nodes. However, these functions can be difficult or costly to perform in various circumstances and for various reasons. For example, two-way time-of-flight techniques are often used in which a signal is transmitted from a first node to a second node, reflected from the second node, and received back at the first node. A distance between the nodes can then be estimated by multiplying the round-trip time of the signal by the speed of the signal and dividing the result by two. Unfortunately, two-way time-of-flight techniques often use radio frequency (RF) or other electromagnetic signals, and these signals travel at the speed of light (approximately $2.998 \times 10^8$ meters per second) in free space. Identifying the round-trip time of a signal traveling at that speed requires the use of a very precise clock source, such as a clock source having a pico-second accuracy, which can be relatively expensive. The use of less accurate (and cheaper) clock sources may introduce large errors into the calculated distances between the nodes. Also, two-way time-of-flight techniques that rely on reflection of a signal can suffer from problems associated with low reflection area or poor reflection characteristics. Further, two-way time-of-flight techniques that rely on reflection can experience multi-path problems in which a transmitted signal is reflected from multiple objects or from an incorrect object (not just an object of interest), which can cause an erroneous distance to be calculated. In addition, two-way time-of-flight techniques often suffer from $1/r^4$ losses, where r represents the distance between the nodes. This means that an electromagnetic signal rapidly weakens as the distance between the nodes increases, which can limit the range of these techniques. While various one-way time-of-flight techniques have been developed, these techniques also often involve the use of very precise clock sources, which can be relatively expensive.

One overriding problem here is that many ranging systems involve "uncooperative" ranging since one node (often a target) does not voluntarily wish to participate in or cannot participate in ranging operations. For example, RADAR and LIDAR systems are often used for target detection, and the target may not wish to be located or to participate in ranging. As another example, laser range-finders are often used to identify distances to objects, and those objects typically cannot participate in range-finding operations (other than to passively reflect laser energy). As yet another example, sonic robotic sensors are often used to identify nearby walls or other obstacles, and those obstacles typically cannot participate in sensing operations (other than to passively reflect sonic energy).

This disclosure provides various techniques for capacitive batch counting to support one-way time-of-flight or other operations. As described in more detail below, capacitive batch counters are provided that can count pulses in signals. Among other things, each capacitive batch counter is able to convert pulses in electromagnetic signals (which can have varying amplitudes due to factors such as distance) into corresponding pulses in electrical signals having known amplitudes. The pulses can be used to trickle-charge or otherwise charge an integration capacitor or other integrating circuit, and the integrating circuit can be reset each time a threshold voltage is reached. The capacitive batch counter can count the number of times that the integrating circuit is reset, and this provides an estimate of the number of pulses received by the capacitive batch counter.

In this way, each capacitive batch counter enables more effective counting of pulses, such as at ultra-high pulse repetition frequencies or other frequencies at which traditional counting circuits would saturate. This can be achieved by allowing each reset of the integrating circuit to act as a proxy for a specific number of pulses, allowing the pulses to be counted in batches. This effectively reduces the number of pulses that are actually counted using a counter circuit. In some cases, the pulses that are being counted may have a pulse repetition frequency that is larger than the clock frequency used by a processor or other components of a system and/or a frequency that is larger than the physical response capabilities of circuit components within the counter circuit. It is also possible to use multiple instances of the integrating circuit and related components in series to provide even larger reductions in the number of pulses that are actually counted using the counter circuit.

The capacitive batch counters described below may be used in any suitable applications. For example, in some embodiments, nodes may be configured to engage in "cooperative" ranging in which two or more nodes cooperate to perform ranging in support of localization and optionally timing synchronization using time-of-flight measurements. As a particular example, RF or other electromagnetic signals can be repeatedly transmitted back-and-forth between a first node and a second node, possibly a large number of times (such as one thousand times or more). An average time-of-flight for each individual electromagnetic signal to travel between the nodes (meaning an average one-way time-of-flight) can be determined and used for localization or other purposes. In these embodiments, the time required for one electromagnetic signal to travel between the first and second nodes may be extremely small and therefore extremely hard to measure accurately. To help compensate for this, multiple (possibly numerous) pulses may be transmitted between the nodes during multiple one-way back-and-forth transmissions, and the pulses can be counted using a capacitive batch counter. In some cases, the pulses can be transmitted and received at various RF frequencies using an RF frequency-hopping pattern. Using the capacitive batch counter, an estimate of the number of pulses transmitted and/or received may be generated and used for time-of-flight calculations or other purposes.

Among other things, these approaches allow a distance between two nodes to be calculated without requiring clock synchronization between the nodes, since the average time-of-flight for the electromagnetic signals can be determined using a single clock source at a single one of the nodes. Also, since the average time-of-flight of multiple electromagnetic signals (rather than the time-of-flight of a single electromagnetic signal) is used, a less accurate clock source can be used for time-of-flight measurements, although a higher-accuracy clock source may still be used if needed or desired. Further, at least one electromagnetic signal can be used to help support synchronization or re-synchronization of clock sources used in different nodes, which allows timing synchronization functionality to be incorporated into localization functionality. It should be noted, however, that this feature is optional since one node need not have a synchronized clock (or any clock for that matter) for the localization functionality described here to operate. Moreover, these approaches avoid reliance on signal reflections, helping to avoid low or poor reflection problems, $1/r^4$ losses, and multi-path problems even when nodes are used indoors. In addition, these approaches can obtain accurate position measurements (such as with centimeter or millimeter accuracy) at longer distances, enabling nodes to be arranged in a coherent array and support desired functionality.

In some embodiments, these techniques may allow nodes in a mobile ad hoc network to be configured to function as a large synthetic aperture antenna for beamforming and to provide fast steering, high gain, and high azimuthal precision. Note, however, that the described approaches may be used for any other suitable purposes and are not limited to use only with time-of-flight calculations. As another example, the described approaches may be used when performing autonomous terminal guidance, such as when the distance between two nodes can be used to support docking or capture of unmanned or other assets (like aircraft or spacecraft). Other potential applications for the described approaches may include use of the described approaches in surveying or mapping applications, intelligent transportation applications, proximity sensing applications (such as for aerial delivery systems), and time-division multiple access (TDMA) or other ad hoc network node localization utilizing mobile smartphones or other portable electronic devices.

FIG. 1 illustrates an example system 100 supporting time-of-flight localization for mobile ad hoc networks in accordance with this disclosure. As shown in FIG. 1, the system 100 generally includes various mobile or other communication nodes 102 and one or more anchor nodes 104. Each communication node 102 generally represents a node that can communicate with the one or more anchor nodes 104 and that can be localized through interactions with the anchor nodes 104. Each communication node 102 may optionally also engage in wireless communications with at least one more-distant node 106. For example, the communication nodes 102 may be operated coherently to provide beamforming or other coherent operations involving the more-distant nodes 106.

At least some of the communication nodes 102 may be mobile, which means that the layout of the communication nodes 102 may vary over time. In order to support localization, the communication nodes 102 are configured to engage in various communications with the anchor nodes 104 in order to help localize the communication nodes 102. This allows at least some of the nodes 102, 104 to identify the locations of the communication nodes 102 with relatively high accuracy. The same communications or different communications may also optionally be used to support timing synchronization of the communication nodes 102, such as relative to a clock source used by one or more anchor nodes 104. Each of the communication nodes 102 includes any suitable structure configured to engage in wireless communications with other devices and to engage in communications to support localization as described in more detail below.

Each anchor node 104 generally represents a node that can communicate with one or more communication nodes 102 and possibly with other anchor nodes 104 to help localize and optionally synchronize the communication nodes 102, such as to support coherent operation of the communication nodes 102. As described in more detail below, electromagnetic signals are repeatedly communicated back-and-forth between the communication nodes 102 and the anchor nodes 104 to support time-of-flight calculations. In this document, an "electromagnetic" signal generally refers to an electromagnetic field propagating through space, typically at the speed of light in free space. Depending on the implementation, an electromagnetic signal may include radio waves, microwaves, infrared light, visible light, ultraviolet light, or other electromagnetic radiation.

In some embodiments, each anchor node 104 may have a fixed position during operation of the communication nodes 102. The anchor nodes 104 in these embodiments may still be portable to some degree, but the anchor nodes 104 may maintain fixed positions during operation of the communication nodes 102. In other embodiments, each anchor node 104 may not have a fixed position during operation of the communication nodes 102. As a result, these anchor nodes 104 may move during operation of the communication nodes 102, which may be permissible if, for example, each anchor node 104 can repeatedly localize the communication nodes 102. In any of these embodiments, each anchor node 104 may include a suitable subsystem for accurately identifying its own location, such as a Global Positioning System (GPS) receiver or other Global Navigation Satellite System (GNSS) receiver. Each of the anchor nodes 104 includes any suitable structure configured to engage in wireless communications with other devices and to localize at least some of those other devices as described in more detail below.

Each node 106 represents any suitable device that communicates with at least one of the communication nodes 102 or anchor nodes 104. For example, a node 106 may represent a distant or covert receiver designed to receive beamformed transmissions from communication nodes 102 that are acting as a coherent beamforming system. Note that while a single node 106 is shown here, the system 100 may include any suitable number of nodes 106, and each node 106 may have any suitable position relative to the other nodes 102, 104 of the system 100.

The nodes 102, 104, 106 here can use any suitable signals to communicate with one another. For example, in some embodiments, at least some of the nodes 102, 104, 106 may use RF signals in the high frequency (HF) band (generally about 3 MHz to about 30 MHz), in the very high frequency (VHF) band (generally about 30 MHz to about 300 MHz), or in the ultra-high frequency (UHF) band (generally about 300 MHz to about 3 GHZ), although other higher or lower RF frequencies or frequency bands may also be used. The localization functionality provided in the system 100 may be used to resolve the positions of the communication nodes 102 with very high accuracy, such as with centimeter or millimeter accuracy. In some embodiments, each communication node 102 can be localized to at least one-tenth of the wavelength used by the communication node 102 for communications, including wavelengths used for HF, VHF, or UHF communications. Thus, for instance, a node 102 communicating at a 73-centimeter wavelength in the UHF band may be localized with an accuracy of about 7.3 centimeters or less. Note, however, that the localization approaches described in this patent document may obtain accuracies much better than one-tenth of the wavelength used for communications, depending on the wavelength.

There are various ways in which the system 100 may be implemented or deployed, depending on the application or use case. For example, in some embodiments, the communication nodes 102 may represent devices carried by personnel (such as in or on their clothing, backpacks, or helmets) or on ground vehicles in a given area, and the anchor nodes 104 may represent devices carried by other personnel, devices carried on other ground vehicles, or devices situated in other ground-based locations. In other embodiments, the communication nodes 102 may represent devices carried on drones, unmanned aerial systems (UASs), or other flight vehicles, and the anchor nodes 104 may represent devices carried on ground vehicles or devices situated in ground-based locations. As a particular example, the communication nodes 102 may be implemented using drones that can achieve an altitude of about four hundred feet to about one thousand feet or more, and one or more anchor nodes 104 may be used on the ground. These approaches allow the system 100 to be used to form high-gain ground or aerial ad hoc networks that can be used for various purposes, such as capturing sensor measurements or other information over the local horizon. Note that these operations may occur continuously or on-demand, such as when drones are launched into the air to capture information and then returned to the ground once the desired information has been obtained. The ability to localize and optionally synchronize multiple communication nodes 102 using one or more anchor nodes 104 may find use in a number of other implementations, as well.

The ability to organize the communication nodes 102 (and possibly the anchor nodes 104 if they participate) into a coherent array 108 can provide various benefits or advantages depending on the implementation. For example, a coherent array 108 may function to provide a large single antenna gain, which allows the resulting antenna formed using the nodes to transmit or receive signals at longer distances. As another example, a coherent array 108 may be harder to jam and therefore provide more resilient or reliable operation. As yet another example, a coherent array 108 may be used for azimuth scanning.

This functionality can therefore benefit its users in various ways. For example, this functionality can be used to help provide improved communication capabilities for first responders, armed forces personnel, or other personnel. This functionality can also be used to help improve ground-to-air communications between personnel on the ground and assets in the air. This functionality can further be used to help provide improved stand-off capabilities for personnel, such as when the system 100 can be used to help identify threats earlier or at larger distances. Moreover, this functionality can be used to help organize drone swarms in order to perform functions like "station keeping," where the drones are organized in a specific way and try to maintain that organization during flight. Beyond that, this functionality may be used to improve the operations of automated facilities (such as driver-less automated warehouses) or autonomous vehicles (such as driver-less passenger vehicles, buses, or other vehicles). In addition to these functional or operational benefits, the localization functionality described in this patent document can be achieved at significantly lower costs compared to conventional approaches such as ultra-wideband (UWB) localization. Various approaches for implementing the localization functionality to help form coherent arrays or perform other functions are described in more detail below. Additional details regarding features of the system 100 or other devices or systems supporting localization may be found in U.S. Patent Publication No. 2023/0199677 A1, which is hereby incorporated by reference in its entirety.

Although FIG. 1 illustrates one example of a system 100 supporting time-of-flight localization for mobile ad hoc networks, various changes may be made to FIG. 1. For example, the system 100 may include any suitable numbers and arrangements of nodes 102, 104, 106. As particular examples, three anchor nodes 104 may be used to localize communication nodes 102 in two-dimensional (2D) space and optionally to synchronize the nodes, and four anchor nodes 104 may be used to localize communication nodes 102 in three-dimensional (3D) space and optionally to synchronize the nodes. Also, the specific arrangement of the communication nodes 102 shown in FIG. 1 can vary over time, and the communication nodes 102 may assume specific arrangements to support desired operations (such as relatively straight lines or generally circular or semi-circular arrangements). In addition, as noted above, it is possible to use the capacitive batch counting techniques of this disclosure in other systems and for other purposes, and the capacitive batch counting techniques of this disclosure are not limited to use with multi-node communication systems or for time-of-flight localization.

Figure 2:
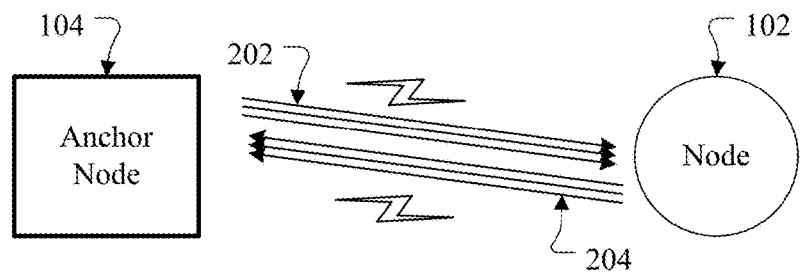
FIG. 2 illustrates example communications supporting time-of-flight localization for mobile ad hoc networks in accordance with this disclosure.

FIG. 2 illustrates example communications supporting time-of-flight localization for mobile ad hoc networks in accordance with this disclosure. In particular, FIG. 2 illustrates an example way in which electromagnetic signals may be used to support time-of-flight localization for mobile ad hoc networks. For ease of explanation, the communications shown in FIG. 2 are described as being used in the system 100 of FIG. 1. However, the communications shown in FIG. 2 may be used in any other suitable system.

As shown in FIG. 2, an anchor node 104 transmits an electromagnetic signal 202 (such as an RF signal) to a communication node 102. When the communication node 102 receives and detects the electromagnetic signal 202, the communication node 102 transmits another electromagnetic signal 204 (such as an RF signal) back to the anchor node 104. Both signals 202 and 204 generally travel at the speed of light. In order to facilitate easier measurement of the time-of-flight with a less-accurate clock source, this process can be repeated a large number of times, such as one thousand times or multiple thousands of times. As a result, multiple electromagnetic signals 202 are sent from the anchor node 104 to the communication node 102, and multiple electromagnetic signals 204 are sent from the communication node 102 to the anchor node 104. In some embodiments, the electromagnetic signals 202 and 204 may use multiple RF frequencies. For instance, the electromagnetic signals 202 may alternate between two RF frequencies, and the electromagnetic signals 204 may alternate between two other RF frequencies (which are different than the RF frequencies of the electromagnetic signals 202).

Given these signals 202 and 204, the anchor node 104 may start a timer upon transmission of the first electromagnetic signal 202 to the communication node 102, and the anchor node 104 may stop the timer once a specific number of electromagnetic signals 202 and 204 have been transmitted/received or after expiration of a specified time. The measured or specified time is reflective of the total combined time-of-flight for all of the electromagnetic signals 202 and 204 to travel between the communication node 102 and the anchor node 104. The measured or specified time also includes any (repeated) processing times of the communication node 102 and any (repeated) processing times of the anchor node 104. However, these processing times can typically be designed or determined by simple calibration with suitable accuracy to allow adjustment of the measured or specified time during which the electromagnetic signals 202 and 204 were transmitted/received in order to identify the actual combined time-of-flight for all of the electromagnetic signals 202, 204. The actual combined time-of-flight may then be divided by the number of electromagnetic signals 202 and 204 communicated between the nodes 102 and 104 in order to identify a time-of-flight for a single electromagnetic signal 202 or 204 (such as an average time-of-flight), and this value can be multiplied by the speed of light in order to identify the distance between the nodes 102, 104. As described below, the number of electromagnetic signals 202 and 204 communicated between the nodes 102 and 104 can be determined using capacitive batch counting.

One advantage of this approach is that clock sources in the two nodes 102, 104 do not need to be synchronized, and the clock source in only one of the two nodes 102, 104 may be used to measure a time-of-flight. That is, only one of the nodes 102, 104 may need to measure a period of time in order to capture a time-of-flight measurement. The other node need not have a synchronized clock source (or any clock source at all) in order for these functions to occur successfully. Also, the electromagnetic signals 202, 204 may be encoded with data, such as an identifier of the node transmitting the electromagnetic signal and/or location data (like a known location of the node transmitting the electromagnetic signal). The use of encoded data may allow, for instance, an anchor node 104 to inform a communication node 102 of its approximate position or to provide any other desired data to the communication node 102. Further, note that a single anchor node 104 may communicate with multiple communication nodes 102 and/or a single communication node 102 may communicate with multiple anchor nodes 104 during different localization operations. In order to support this, communications may be encoded, such as with specific device identifiers, in order to control which node is being localized. In addition, an anchor node 104 may communicate with different communication nodes 102 sequentially (or vice versa).

Although FIG. 2 illustrates one example of communications supporting time-of-flight localization for mobile ad hoc networks, various changes may be made to FIG. 2. For example, the numbers of electromagnetic signals 202, 204 may vary, such as based on the desired length of time in which the signals are transmitted and the distance between the nodes 102, 104. Also, the process shown in FIG. 2 may occur repeatedly in order to identify multiple combined times-of-flight, average one-way times-of-flight, or distances, which can then be averaged or otherwise processed to identify a final combined time-of-flight, average one-way time-of-flight, or distance. Further, the direction of communication in FIG. 2 may be reversed so that the communication node 102 initiates the communications and measures the combined time-of-flight. In addition, as noted above, it is possible to use the capacitive batch counting techniques of this disclosure in other systems and for other purposes, and the capacitive batch counting techniques of this disclosure are not limited to use with multi-node communication systems or for time-of-flight localization.

Figure 3:
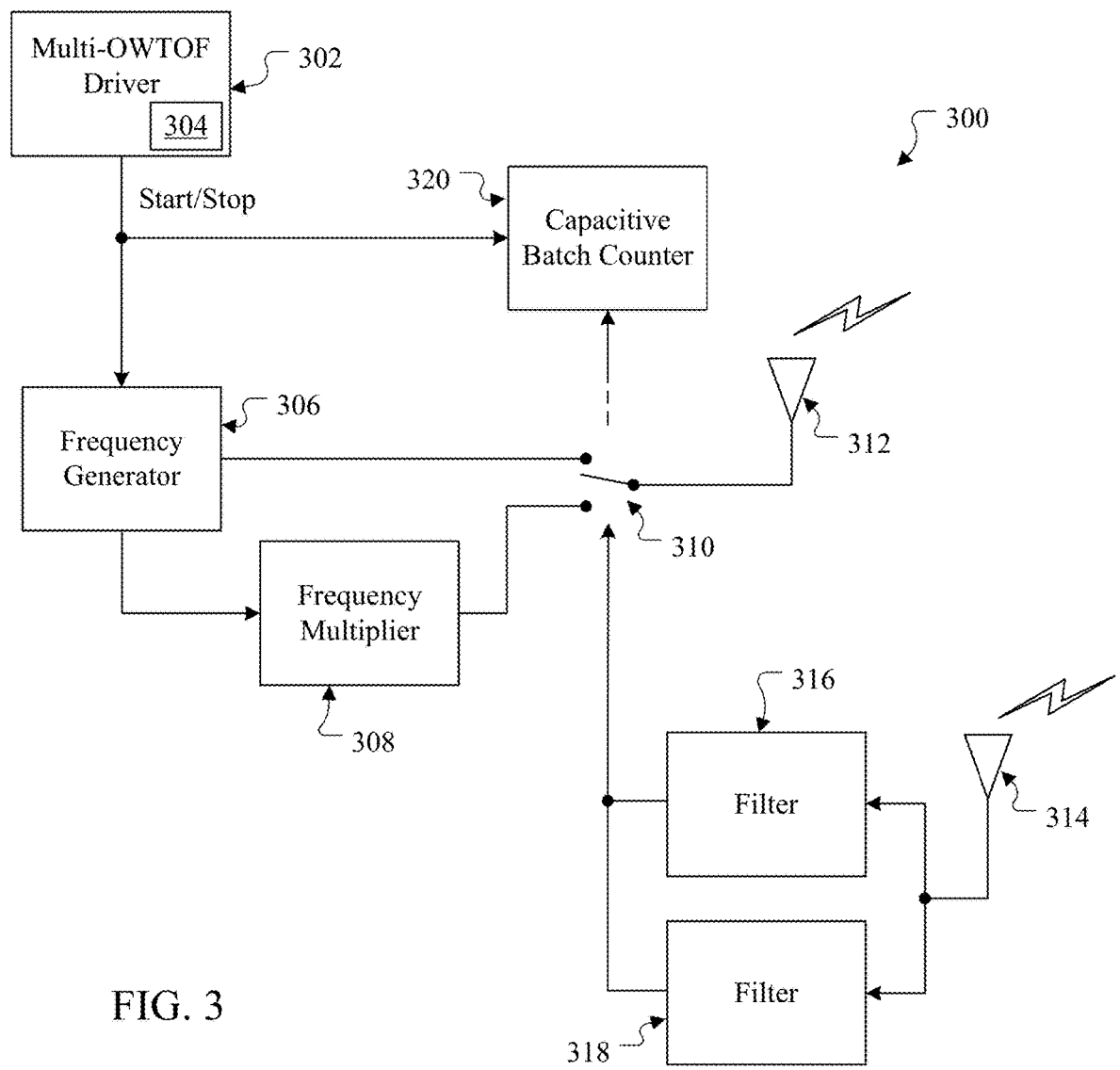
FIG. 3 illustrates an example architecture supporting time-of-flight localization for mobile ad hoc networks in accordance with this disclosure.

FIG. 3 illustrates an example architecture 300 supporting time-of-flight localization for mobile ad hoc networks in accordance with this disclosure. For example, the architecture 300 in FIG. 3 may represent an example implementation of at least part of an anchor node 104 supporting time-of-flight calculations. For ease of explanation, the architecture 300 of FIG. 3 is described as being used in the system 100 of FIG. 1 along with the communication scheme shown in FIG. 2. However, the architecture 300 of FIG. 3 may be used in any other suitable system and with any other suitable communication scheme, and the architecture 300 of FIG. 3 may be used for purposes other than localization.

As shown in FIG. 3, the architecture 300 includes a multi-one-way time-of-flight (multi-OWTOF) driver 302. The driver 302 generally operates to control other components of the architecture 300 in order to enable multiple one-way communications to and from the architecture 300, which can be used for time-of-flight localization. For example, the driver 302 may be used to start and stop generation of RF or other electromagnetic signals used for time-of-flight calculations, as well as to start and stop counting of the electromagnetic signals. In some cases, the driver 302 may include or be used in conjunction with a timer 304, which can be used to measure the period of time during which electromagnetic signals are transmitted and received by the architecture 300. The driver 302 includes any suitable structure configured to control one or more operations in the architecture 300, such as one or more microprocessors, microcontrollers, digital signal processors (DSPs), field programmable gate arrays (FPGAs), application specific integrated circuits (ASICs), or discrete circuitry. The timer 304 includes any suitable structure configured to measure a period of time. In some cases, the timer 304 does not necessarily need to be extremely precise (although it may be).

An RF frequency generator 306 generates RF or other electromagnetic signals having at least a first RF frequency (denoted $f_1$), and an RF frequency multiplier 308 generates additional RF or other electromagnetic signals having at least a second RF frequency (denoted $f_2$). In some embodiments, for example, $f_2=2\times f_1$. The RF frequency generator 306 can be controlled by the driver 302 in order to allow for controllable generation of the electromagnetic signals here. A switch 310 can be used to selectively couple the RF frequency generator 306 or the RF frequency multiplier 308 to a transmit antenna 312, where the transmit antenna 312 can transmit the electromagnetic signals from the RF frequency generator 306 and the RF frequency multiplier 308 to an external destination (such as a communication node 102). The RF frequency generator 306 includes any suitable structure configured to generate RF or other electromagnetic signals having at least one desired RF frequency. The RF frequency multiplier 308 includes any suitable structure configured to generate RF or other electromagnetic signals having double or other increased RF frequency relative to its input. Note that the RF frequency generator 306 and the RF frequency multiplier 308 here are meant to represent two or more signal sources that can generate electromagnetic signals at different RF frequencies. However, any other suitable signal source(s) may be used to generate electromagnetic signals at different RF frequencies, such as by using two RF frequency generators 306 (eliminating the need for an RF frequency multiplier 308). The switch 310 includes any suitable structure configured to selectively couple a signal source to the transmit antenna 312, such as one or more transistors. The transmit antenna 312 includes any suitable structure configured to transmit electromagnetic signals.

A receive antenna 314 receives electromagnetic signals from an external source (such as the communication node 102 that is receiving the electromagnetic signals from the transmit antenna 312). The received electromagnetic signals may include RF or other electromagnetic signals having at least a third RF frequency (denoted $f_3$) and RF or other electromagnetic signals having at least a fourth RF frequency (denoted $f_2$). In some embodiments, for example, $f_4=2\times f_3$. Filters 316 and 318 are used to filter the electromagnetic signals received by the receive antenna 314. For example, the filter 316 may represent a bandpass or other filter that allows passage of the third RF frequency and nearby RF frequencies while filtering other RF frequencies (such as the fourth RF frequency), and the filter 318 may represent a bandpass or other filter that allows passage of the fourth RF frequency and nearby RF frequencies while filtering other RF frequencies (such as the third RF frequency). The filters 316 and 318 may therefore be used to sense when the electromagnetic signals from the external source transition from the third RF frequency to the fourth RF frequency and from the fourth RF frequency to the third RF frequency.

Figure 4:
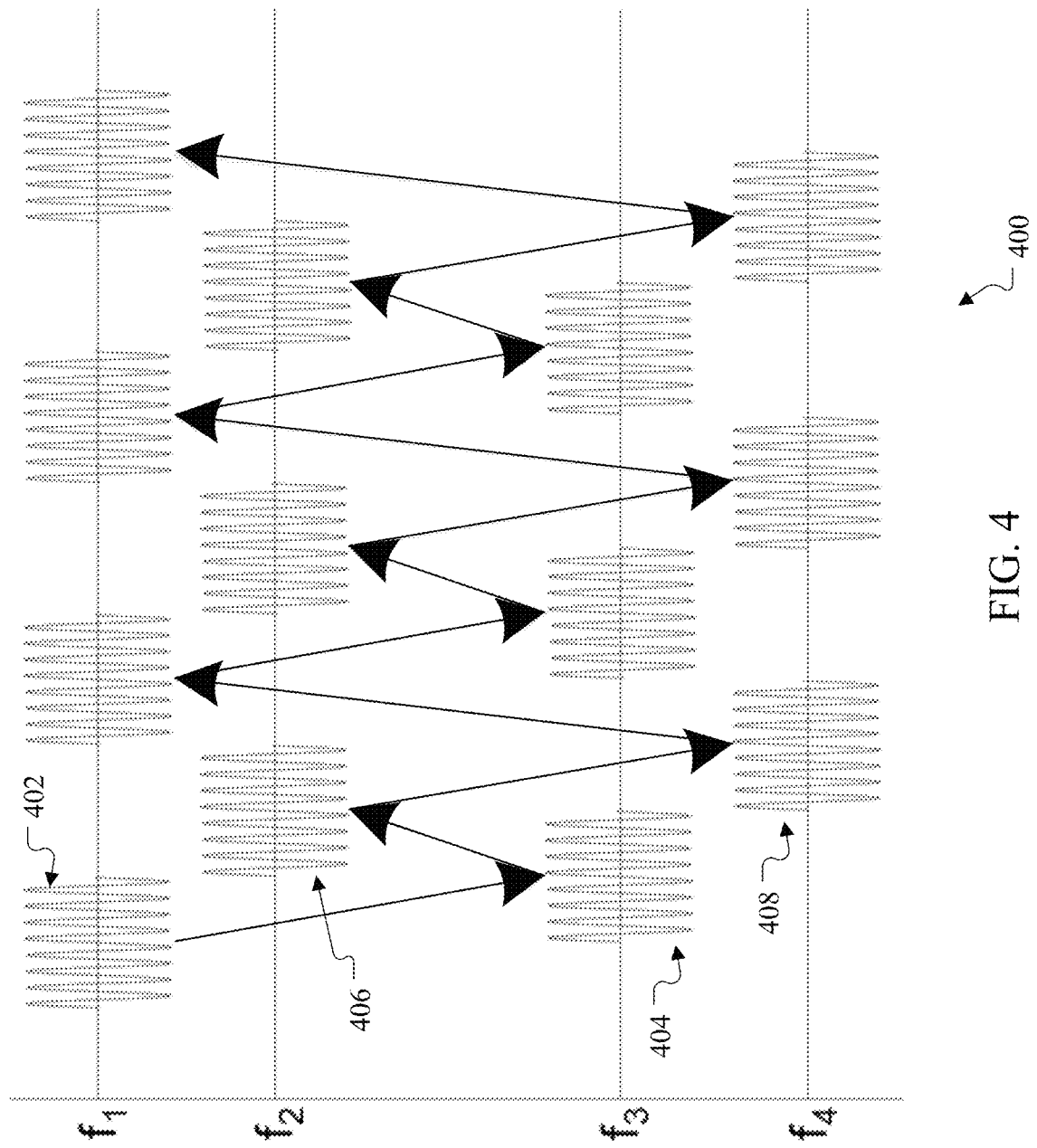
FIG. 4 illustrates an example radio frequency (RF) pulse pattern supporting time-of-flight localization for mobile ad hoc networks in accordance with this disclosure.

The detected transitions within the received electromagnetic signals may be used to control the switch 310. For example, the switch 310 may initially be configured to couple the RF frequency generator 306 to the transmit antenna 312. In response to a transition from the fourth RF frequency to the third RF frequency within the received electromagnetic signals, the switch 310 may be controlled to couple the RF frequency multiplier 308 to the transmit antenna 312. In response to a transition from the third RF frequency to the fourth RF frequency, the switch 310 may be controlled to couple the RF frequency generator 306 to the transmit antenna 312. One example of this type of RF frequency hopping approach is shown in FIG. 4, which is described below. The receive antenna 314 includes any suitable structure configured to receive electromagnetic signals. Note that while the antennas 312 and 314 are shown separately here, the antennas 312 and 314 may be combined into a single integrated structure. Each filter 316 and 318 includes any suitable structure configured to filter electromagnetic signals, such as a low-pass, bandpass, or high-pass filter.

Figure 5:
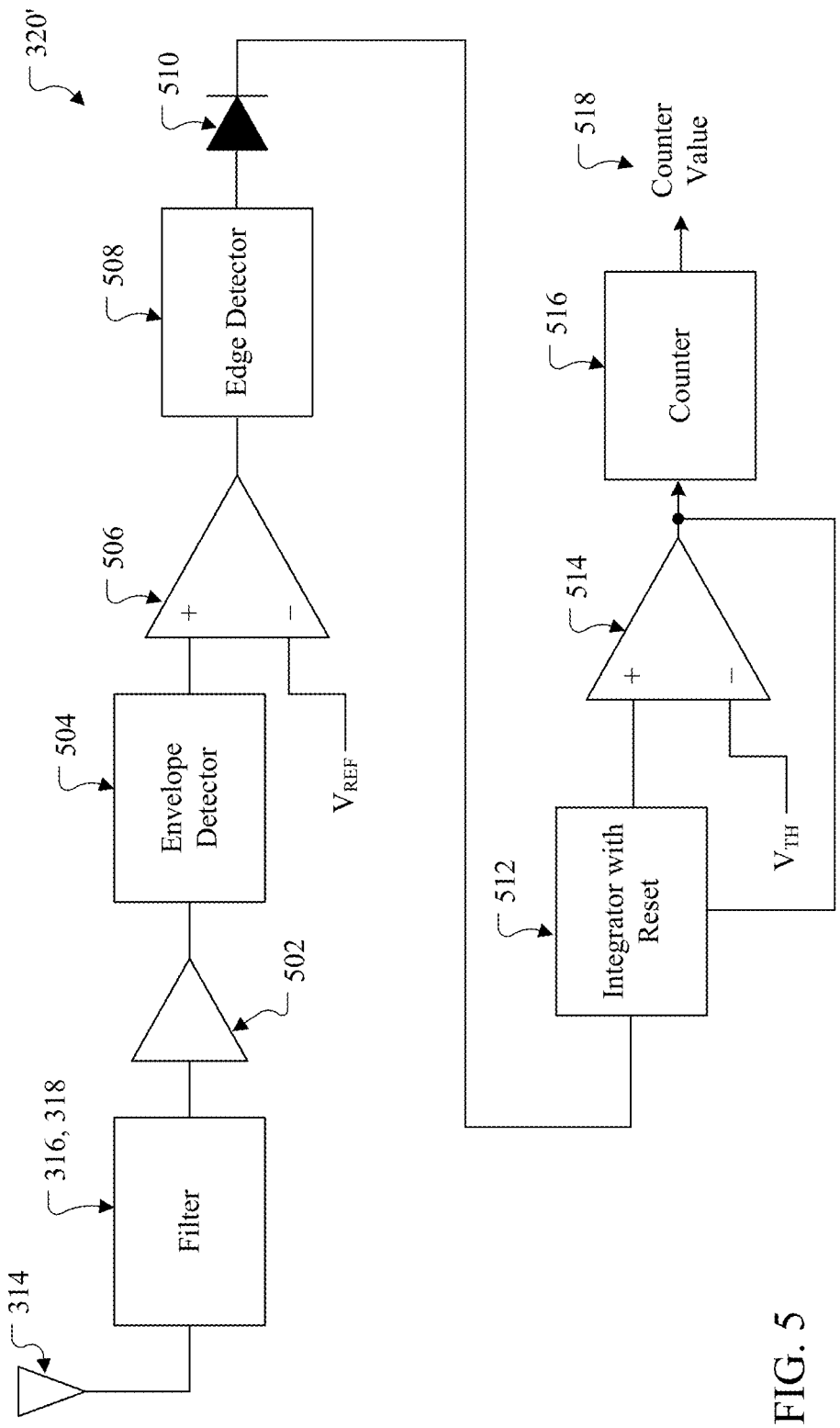
FIGS. 5 and 6 illustrate example capacitive batch counters in accordance with this disclosure.
Figure 6:
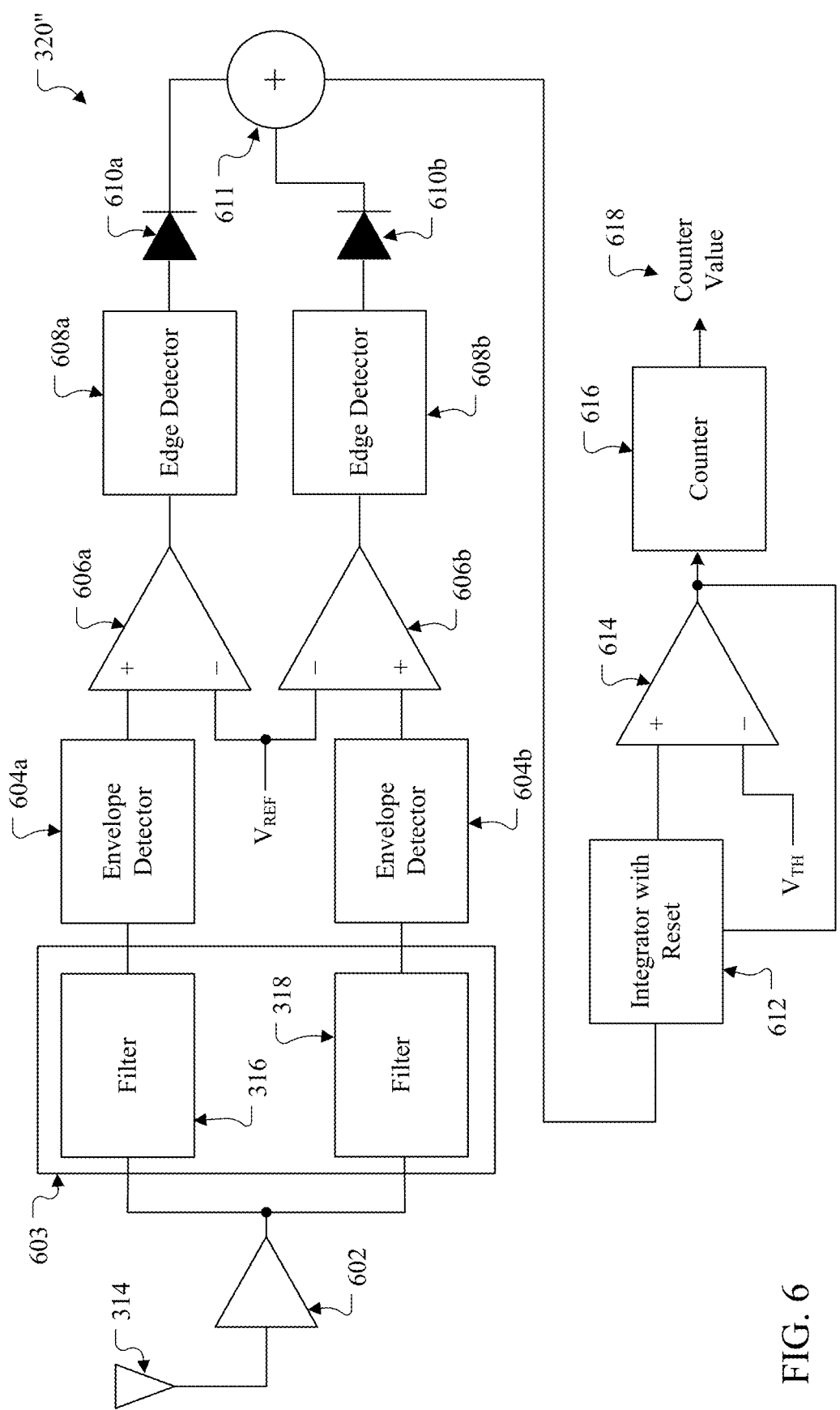

A capacitive batch counter 320 is used to proxy-count the number of electromagnetic pulses transmitted and/or received by the architecture 300. For example, the capacitive batch counter 320 can be used to charge an integrating circuit, and the charge that is stored on the integrating circuit can be indicative of the number of electromagnetic pulses transmitted and/or received by the architecture 300. Example embodiments of the capacitive batch counter 320 are shown in FIGS. 5 and 6, which are described below.

Traditional counters can saturate quickly when attempting to count pulses that are received rapidly. This saturation can be due to various factors, such as limits on system processor clock frequencies and/or circuit component physical response capabilities. Because of this, above a certain maximum switching event saturation frequency, events to be counted will be missed or lost, and the measured count value will be the same for all event frequencies above this threshold. When used for localization by counting repeated transmissions/receptions of speed-of-light electromagnetic signals to determine accurate distances between two or more cooperative devices, a traditional counter will be unable to discern accurate distances below some threshold minimum distance. This condition may occur, for example, when the nodes 102 and 104 are relatively close to one another, such as within nine meters or other distance of one another. The capacitive batch counter 320 helps to overcome these or other issues by counting groups of pulses contained in electromagnetic signals, rather than by counting each individual pulse in the electromagnetic signals. Moreover, the capacitive batch counter 320 can pre-process the pulses in the electromagnetic signals so that the integrating circuit receives electrical signals that are independent of the amplitude of the RF or other electromagnetic signals received by the receive antenna 314. Additional details regarding example designs and operations of the capacitive batch counter 320 are provided below.

The count value that is generated and output by the capacitive batch counter 320 may be used in any suitable manner. For example, a processor or other component of a larger system (such as the anchor node 104) can multiply the count value from the capacitive batch counter 320 by a known or calculable number of pulses contained in each batch of pulses counted by the capacitive batch counter 320. The processor or other component of the larger system may use the resulting value as the total number of pulses and use the time period during which counting occurs to perform time-of-flight calculations. However, the count value that is generated and output by the capacitive batch counter 320 may be used in any other suitable manner and for any other suitable purposes.

Note that the architecture 300 shown in FIG. 3 may be used in the device or system that is performing time-of-flight calculations, such as an anchor node 104. The other device or system that is cooperating in the time-of-flight calculations by receiving and sending signals may have a similar design. For instance, a communication node 102 or other device or system may include many of the same components shown in FIG. 3 but may lack a timer 304 and a counter 320. Thus, for example, the communication node 102 or other device or system may include an RF frequency generator 306 that operates at least at the third RF frequency $f_3$ and an RF frequency multiplier 308 that produces at least the fourth RF frequency $f_4$. However, as noted above, any other suitable signal source(s) may be used to generate electromagnetic signals at different RF frequencies, such as by using two RF frequency generators 306 (eliminating the need for an RF frequency multiplier 308). The communication node 102 or other device or system may also include a switch 310 that selectively couples the RF frequency generator 306 and the RF frequency multiplier 308 to a transmit antenna 312. The communication node 102 or other device or system may further include a receive antenna 314 that receives signals at the first and second RF frequencies $f_1$ and $f_2$, as well as filters 316 and 318 that toggle the switch 310 in response to transitions between the first and second RF frequencies $f_1$ and $f_2$. This allows the anchor node 104 to toggle back and forth between transmitting at the first RF frequency $f_1$ and transmitting at the second RF frequency $f_1$, and this allows the communication node 102 to toggle back and forth between transmitting at the third RF frequency $f_3$ and transmitting at the fourth RF frequency $f_4$.

Although FIG. 3 illustrates one example of an architecture 300 supporting time-of-flight localization for mobile ad hoc networks, various changes may be made to FIG. 3. For example, various components shown in FIG. 3 may be combined, further subdivided, rearranged, replicated, or omitted and additional components can be added according to particular needs. Also, any other suitable techniques may be used to generate RF or other electromagnetic signals. In addition, as noted above, it is possible to use the capacitive batch counter 320 in other systems and for other purposes, and the capacitive batch counter 320 is not limited to use with the specific structure shown in FIG. 3 and is not limited to use during time-of-flight localization.

FIG. 4 illustrates an example RF pulse pattern 400 supporting time-of-flight localization for mobile ad hoc networks in accordance with this disclosure. More specifically, the RF pulse pattern 400 may be used with the architecture 300 shown in FIG. 3, where the architecture 300 (or some form of the architecture 300) is used by the anchor node 104 and by the communication node 102 shown in FIG. 1 to engage in the communication scheme shown in FIG. 2.

As shown in FIG. 4, the RF frequency pulse pattern 400 is associated with electromagnetic signals having four RF frequencies $f_1$, $f_2$, $f_3$, and $f_4$. The RF frequencies $f_1$ and $f_2$ can be associated with electromagnetic signals 202 sent from the anchor node 104 to the communication node 102, and the RF frequencies $f_3$ and $f_4$ can be associated with electromagnetic signals 204 sent from the communication node 102 to the anchor node 104. Thus, for example, electromagnetic signals with the RF frequency $f_1$ may be generated by the RF frequency generator 306 of the anchor node 104, and electromagnetic signals with the RF frequency $f_2$ may be generated by the RF frequency multiplier 308 of the anchor node 104. Similarly, electromagnetic signals with the RF frequency $f_3$ may be generated by the RF frequency generator 306 of the communication node 102, and electromagnetic signals with the RF frequency f: may be generated by the RF frequency multiplier 308 of the communication node 102.

As can be seen in this example, the anchor node 104 may originally communicate a pulse 402 at the first RF frequency $f_1$, such as by having the switch 310 couple the RF frequency generator 306 to the transmit antenna 312 in the anchor node 104. This pulse 402 is received by the communication node 102 and causes the communication node 102 to respond with a pulse 404 at the third RF frequency $f_3$, such as by having the switch 310 couple the RF frequency generator 306 to the transmit antenna 312 in the communication node 102. This pulse 404 is received by the anchor node 104 and causes the anchor node 104 to respond with a pulse 406 at the second RF frequency $f_2$, such as by having the switch 310 couple the RF frequency multiplier 308 to the transmit antenna 312 in the anchor node 104. This pulse 406 is received by the communication node 102 and causes the communication node 102 to respond with a pulse 408 at the fourth RF frequency $f_4$, such as by having the switch 310 couple the RF frequency multiplier 308 to the transmit antenna 312 in the communication node 102. The pulse 408 is received by the anchor node 104 and causes the anchor node 104 to restart the pattern by transmitting another pulse at the first RF frequency $f_1$. As described below, the capacitive batch counter 320 can be used to count at least some of the pulses 402-408 here, such as when the capacitive batch counter 320 is used to count the pulses 404 and/or the pulses 408. In some embodiments, this allows the capacitive batch counter 320 to be used for time-of-flight calculations based on the counted number of pulses.

Although FIG. 4 illustrates one example of an RF pulse pattern 400 supporting time-of-flight localization for mobile ad hoc networks, various changes may be made to FIG. 4. For example, the repeating sequence of pulses in the RF frequency pulse pattern 400 may start at any of the identified RF frequencies. Also, it is possible to use more than two RF frequencies at each node to form the RF pulse pattern 400.

FIGS. 5 and 6 illustrate example capacitive batch counters 320' and 320" in accordance with this disclosure. For ease of explanation, the capacitive batch counters 320' and 320" shown in FIGS. 5 and 6 are described as being used in the architecture 300 shown in FIG. 3 within the system 100 shown in FIG. 1, along with the communication scheme shown in FIG. 2. However, the capacitive batch counters 320' and 320" shown in FIGS. 5 and 6 may be used in any other suitable architectures or systems and with any other suitable communication schemes. Also, the capacitive batch counters 320' and 320" shown in FIGS. 5 and 6 may be used for purposes other than localization.

As shown in FIG. 5, the capacitive batch counter 320' may be used in conjunction with a receive antenna 314 and a filter 316 or 318. In other words, the capacitive batch counter 320' processes electromagnetic signals having one of the RF frequencies $f_3$ or $f_4$. Here, a low-noise amplifier (LNA) 502 amplifies filtered incoming electromagnetic signals from the filter 316 or 318, and an envelope detector 504 generates an output defining an envelope around the filtered and amplified incoming electromagnetic signals. A comparator 506 compares the envelope around the filtered and amplified incoming electromagnetic signals to a reference voltage $V_{REF}$, and the comparator 506 can generate a digital output having a high or low value depending on whether or not the envelope equals or exceeds the reference voltage $V_{REF}$. Each of the high and low values in the digital output of the comparator 506 can have a fixed known voltage. Essentially, this converts pulses in the filtered incoming electromagnetic signals (which can have varying amplitudes depending on the amount of RF or other electromagnetic energy received) into corresponding pulses having a standard or other well-defined and known amplitude. The amplifier 502 includes any suitable structure configured to amplify electromagnetic signals. The envelope detector 504 includes any suitable structure configured to detect an envelope around electromagnetic signals, such as a half-wave rectifier with a filter. The comparator 506 includes any suitable structure configured to compare electrical signals.

An edge detector 508 processes the output of the comparator 506 in order to identify edges within the output of the comparator 506. This means that the edge detector 508 can identify rising or leading edges and falling or trailing edges of the pulses within the output of the comparator 506. A rectifier 510 blocks the undesired trailing or leading edges of the pulses as contained in the output of the edge detector 508, so the output of the rectifier 510 identifies only the desired leading or trailing edges of the pulses contained within the output of the comparator 506. At this point, the output of the rectifier 510 is independent of the properties of the received electromagnetic pulses. For example, the output of the rectifier 510 can be independent of the amplitude and pulse length of the received electromagnetic pulses. The edge detector 508 includes any suitable structure configured to identify edges within a signal, such as a differentiator or a high-pass filter. The rectifier 510 includes any suitable structure configured to limit electrical current flow to a single direction, such as a diode. Note that the use of the rectifier 510 is optional, such as when the edge detector 508 is capable of identifying only leading edges or only trailing edges of pulses (so rectification may not be needed). Collectively, the components that are used to convert received electromagnetic signals into an electrical signal that identifies at least some edges of the pulses contained within the received electromagnetic signals may be referred to as a front-end.

The edges of the pulses as identified by the rectifier 510 are provided to an integrator 512, which includes an integration capacitor or other integrating circuit. The integrating circuit is charged based on the output of the rectifier 510, effectively allowing the charge on the integrating circuit to be representative of the number of pulse edges received by the integrating circuit. An output of the integrator 512 is provided to a comparator 514, which compares the voltage stored on the integrating circuit to a threshold voltage $V_{TH}$. The comparator 514 can generate a digital output having a high or low value depending on whether or not the voltage stored on the integrating circuit equals or exceeds the threshold voltage $V_{TH}$.

The output of the comparator 514 can also reset the voltage stored on the integrating circuit in the integrator 512, which can reset the digital output of the comparator 514. For example, the comparator 514 can generate a digital output having a low value when the voltage stored on the integrating circuit does not equal or exceed the threshold voltage $V_{TH}$, which allows the integrating circuit of the integrator 512 to continue charging based on the pulse edges provided by the rectifier 510. At some point, the comparator 514 can generate a digital output having a high value when the voltage stored on the integrating circuit equals or exceeds the threshold voltage $V_{TH}$. This high value can cause the integrator 512 to reset the integrating circuit, such as by controlling a switch to discharge the integrating circuit. This causes the comparator 514 to again generate a digital output having a low value since the voltage stored on the integrating circuit does not equal or exceed the threshold voltage $V_{TH}$, which allows the integrating circuit of the integrator 512 to start charging again based on the pulse edges provided by the rectifier 510. The integrator 512 includes any suitable structure configured to integrate an electrical signal. The comparator 514 includes any suitable structure configured to compare electrical signals.

A counter 516 can count the number of times that the comparator 514 outputs a high digital output, which provides an indication of the number of times that the integrating circuit of the integrator 512 is charged and reset. The charge on the integrating circuit is based on the number of pulses received in the incoming electromagnetic signals, and those pulses are converted to a known amplitude due to the operations of the envelope detector 504, comparator 506, edge detector 508, and rectifier 510. As a result, a count value 518 generated by the counter 516 can be indicative of the number of pulses received in the incoming electromagnetic signals. The counter 516 includes any suitable structure configured to count a number of pulses or transitions in a signal, such as a counter implemented using one or more multiplexer chips.

The approach shown in FIG. 5 allows the integrating circuit of the integrator 512 to be "trickle-charged" using the output of the rectifier 510. Also, batches of pulses contained in the incoming electromagnetic signals are counted together and represented using a single trigger of the comparator 514. This is because each instance of the comparator 514 outputting a high digital output is representative of a known or calculable number of pulses in the incoming electromagnetic signals. This allows for effective counting of the pulses received in the incoming signals, even when the pulses are received very rapidly. This also allows for more effective time-of-flight calculations or other operations that are based on the count values 518 generated by the capacitive batch counter 320'.

The capacitive batch counter 320" shown in FIG. 6 is similar in structure to the capacitive batch counter 320' shown in FIG. 5. However, while the capacitive batch counter 320' shown in FIG. 5 can proxy-count the number of pulses contained in electromagnetic signals at one of the RF frequencies $f_3$ or $f_4$, the capacitive batch counter 320 shown in FIG. 6 can proxy-count the number of pulses contained in electromagnetic signals at both of the RF frequencies $f_3$ and $f_4$. For brevity, the descriptions of common components between FIGS. 5 and 6 are not repeated below, and the descriptions of components shown in FIG. 5 apply equally to corresponding components shown in FIG. 6.

As shown in FIG. 6, the capacitive batch counter 320" may be used in conjunction with a receive antenna 314. Here, a low-noise amplifier 602 amplifies incoming electromagnetic signals from the receive antenna 314. Filters 316 and 318 are used to filter the amplified incoming electromagnetic signals, such as to separate and isolate the incoming electromagnetic signals having the RF frequencies $f_3$ and $f_4$. In some cases, the filters 316 and 318 may be implemented using a common structure, such as a diplexer 603. The diplexer 603 represents any suitable structure configured to perform RF frequency-domain demultiplexing or to otherwise separate signals at different RF frequencies or in different RF frequency ranges.

Envelope detectors 604a-604b generate outputs defining envelopes around the filtered and amplified incoming electromagnetic signals, and comparators 606a-606b compare the envelopes around the filtered and amplified incoming electromagnetic signals to a reference voltage $V_{REF}$. This converts pulses in the filtered incoming electromagnetic signals (which can have varying amplitudes depending on the amount of RF or other electromagnetic energy received) into pulses having a standard or other well-defined and known amplitude. Edge detectors 608a-608b process the outputs of the comparators 606a-606b in order to identify edges within the outputs of the comparators 606a-606b. Rectifiers 610a-610b block the trailing or leading edges of the pulses in the outputs of the edge detectors 608a-608b, and the outputs of the rectifiers 610a-610b identify only the leading or trailing edges of the pulses contained within the outputs of the comparators 606a-606b. Note that the use of the rectifiers 610a-610b is optional, such as when the edge detectors 608a-608b are capable of identifying only leading edges or only trailing edges of pulses. The outputs of the rectifiers 610a-610b are combined using a combiner 611, and the output of the combiner 611 therefore collectively identifies the leading edges of the pulses contained within the outputs of both comparators 606a-606b. The combiner 611 includes any suitable structure configured to combine electrical signals. At this point, the output of the combiner 611 is independent of the properties of the received electromagnetic pulses. For example, the output of the combiner 611 can be independent of the amplitude and pulse length of the received electromagnetic pulses. Effectively, the capacitive batch counter 320" includes multiple front-ends, which are configured to convert electromagnetic signals received at different RF frequencies into electrical signals that identify at least some edges of the pulses contained within the electromagnetic signals at the different RF frequencies.

The edges of the pulses are provided to an integrator 612, which includes an integration capacitor or other integrating circuit and is coupled to a comparator 614. The integrating circuit is charged based on the output of the combiner 611, effectively allowing the charge on the integrating circuit to be representative of the number of pulse edges received by the integrating circuit. The comparator 614 compares the voltage stored on the integrating circuit to a threshold voltage $V_{TH}$, and the output of the comparator 614 can reset the voltage stored on the integrating circuit in the integrator 612, which can reset the digital output of the comparator 614. A counter 616 can count the number of times that the comparator 614 outputs a high digital output, which provides an indication of the number of times that the integrating circuit of the integrator 612 is charged and reset. Again, the approach shown in FIG. 6 allows the integrating circuit of the integrator 612 to be "trickle-charged" using the output of the combiner 611, which allows for the counting of batches of pulses received in the incoming signals and supports time-of-flight calculations or other operations based on count values 618.

Note that the integrators 512, 612a-612b and comparators 514, 614 here provide a reduction in the number of pulses being counted by the counters 516, 616. For example, if each integrator 512, 612a-612b can receive 500 pulse edges before its integrating circuit is charged to the point that the corresponding comparator 514, 614 toggles its output to a high value, the counter 516, 616 is able to count pulses that are each representative of 500 pulses (rather than counting the 500 pulses individually). Another component, such as a processor or other component of a larger system, may multiply a count value 518, 618 by 500 in order to estimate the number of pulses actually received. This allows for the use of counters 516, 616 that may be technically unable to individually count the pulses in the electromagnetic signals. If necessary or desirable, one or more residual charges stored on the integrating circuit(s) of the integrator(s) 512, 612a-612b at the end of a sampling period may be identified and used to estimate how many pulses were received by the integrating circuit without toggling the output of the comparator 514, 614 to a high value. This may enable an even more accurate estimate of the number of pulses received.

Also note that it is possible to use multiple instances of the integrators 512, 612a-612b and comparators 514, 614 coupled in series. For instance, the integrator(s) 512, 612a-612b in one instance may collect 500 pulses from electromagnetic signals, and the integrator(s) 512, 612a-612b in the following instance may collect 500 pulses from the comparator(s) 514, 614 in the earlier instance. In that case, the counter 516, 616 would count pulses each representing 250,000 pulses from the electromagnetic signals (resulting in a 250,000-to-1 reduction in the counting by the counter 516, 616).

As can be seen here, the described approaches may effectively serve as a throttling mechanism that is placed in-series ahead of the counter 516, 616, which may be implemented using a traditional or other lower-frequency-capable counting circuit or device. For many practical applications (such as counting repeated transmissions and receptions of electromagnetic signals to determine accurate distances between two or more cooperative devices), an exact pulse count is not required, and an estimated pulse count determined using the count value 518, 618 may be sufficient.

Overall, the capacitive batch counters 320, 320', 320" described above can provide various benefits or advantages depending on the implementation. For example, the capacitive batch counters 320, 320', 320" may leverage at least one in-series differentiator-into-rectifier circuit in order to trickle-charge an integrating circuit and support "proxy" counting of state transitions in signals. Moreover, the capacitive batch counters 320, 320', 320" can support proxy counting of state transitions in signals faster than system processor clock frequencies and faster than circuit component physical response capabilities. Further, the capacitive batch counters 320, 320', 320" can enables distance measurements between cooperative nodes using inexpensive, lower-precision clocks or without requiring any clocks at all (just a timer), which can reduce costs. This can be particularly beneficial for devices that may be considered expendable, such as munitions or small drones.

Although FIGS. 5 and 6 illustrate examples of capacitive batch counters 320' and 320", various changes may be made to FIGS. 5 and 6. For example, various components shown in FIGS. 5 and 6 may be combined, further subdivided, rearranged, replicated, or omitted and additional components can be added according to particular needs. As a particular example, the combiner 611 may be omitted, and separate integrators 612, comparators 614, and counters 616 may be used with the electromagnetic signals at the RF frequencies $f_3$ and $f_4$. Also, each of the components shown in FIGS. 5 and 6 may be implemented using any suitable circuitry that performs the recited function or functions of that component. In addition, while the capacitive batch counters 320' and 320" are shown as being used with components of the architecture 300, the capacitive batch counters 320' and 320" may be used in any other suitable architectures to count electromagnetic signal pulses.

FIGS. 7A through 7F illustrate example signals associated with a capacitive batch counter in accordance with this disclosure, and FIGS. 8A through 8H illustrate other example signals associated with a capacitive batch counter in accordance with this disclosure. In particular, FIGS. 7A through 7F illustrate example signals that may be generated by or otherwise associated with the capacitive batch counter 320' shown in FIG. 5, and FIGS. 8A through 8H illustrate example signals that may be generated by or otherwise associated with the capacitive batch counter 320" shown in FIG. 6.

Figure 7A:
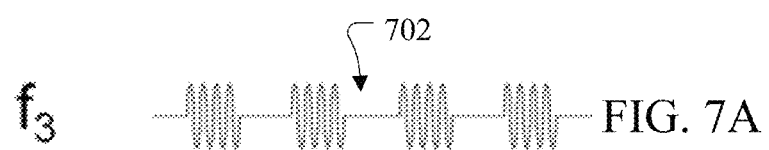
FIGS. 7A through 7F illustrate example signals associated with a capacitive batch counter in accordance with this disclosure.
Figure 7B:
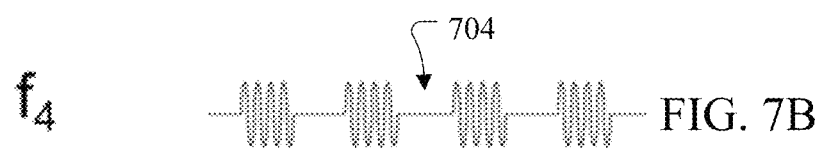
Figure 7C:
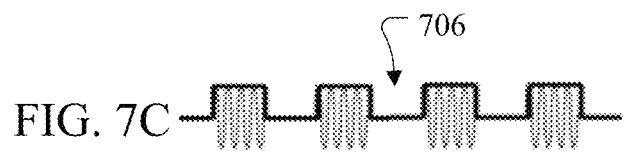

As shown in FIGS. 7A and 7B, signals 702 and 704 represent incoming electromagnetic signals that may be received by the architecture 300, such as when the signals 702 and 704 are transmitted by a communication node 102 and received by an anchor node 104. As shown here, the signal 702 uses the third RF frequency $f_3$, and the signal 704 uses the fourth RF frequency $f_4$. Each of the signals 702 and 704 includes a collection of pulses, and the pulses in each of the signals 702 and 704 are separated from one another by a period of time. As shown in FIG. 7C, a signal 706 represents an example output generated by the comparator 506, where each pulse in the signal 702 or 704 has been converted to a square or rectangular pulse in the signal 706. In this particular example, the signal 704 is used to generate the signal 706 (although the signal 702 may be used instead). The signal 706 here essentially contains "boxcar" pulses, where the leading and trailing transitions in the signal 706 track the leading and trailing edges of the corresponding pulses in the signal 704.

Figure 7D:
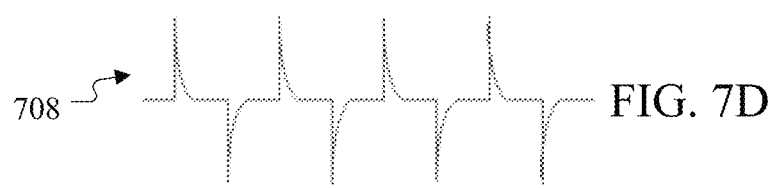
Figure 7E:
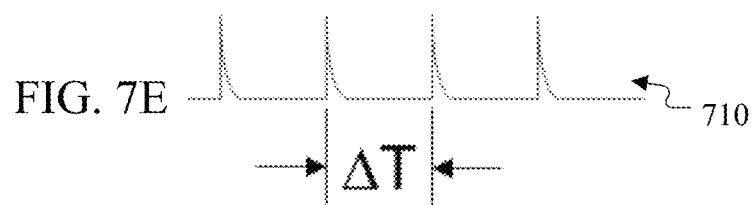

As shown in FIG. 7D, a signal 708 represents an example output generated by the edge detector 508, where leading edges of the pulses in the signal 706 are converted into positive spikes and trailing edges of the pulses in the signal 706 are converted into negative spikes in the signal 708. As shown in FIG. 7E, a signal 710 represents an example output generated by the rectifier 510, where positive spikes in the signal 708 are maintained and negative spikes in the signal 708 are blocked (although the negative spikes may be maintained and the positive spikes can be blocked). As a result, the signal 710 is indicative of the beginning locations of pulses contained in the signal 704. Each spike in the signal 710 is generally separated from adjacent spikes by a time $\Delta T$, which is based on the pulse repetition frequency on the $f_4$ signal 704 (or based on the pulse repetition frequency of $f_3$ if the signal 702 is used).

Figure 7F:
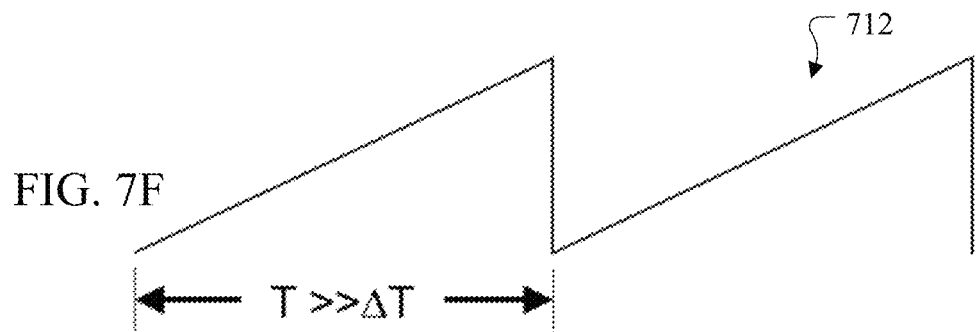

As shown in FIG. 7F, a signal 712 represents the voltage stored on the integration capacitor or other integrating circuit of the integrator 512. As can be seen here, the voltage stored on the integrating circuit generally increases for a time period T, where T is typically much larger than $\Delta T$ and varies based on the specific signal 704 (or the specific signal 702) being processed. Eventually, the charge stored on the integrating circuit of the integrator 512 reaches or exceeds the threshold voltage $V_{TH}$, which causes the comparator 514 to reset the integrating circuit by discharging the integrating circuit. The integrating circuit may then be charged again, and the process may continue any number of times. The counter 516 can count the number of times that the integrating circuit is reset, which is also based on the number of times that the comparator 514 toggles its output high to indicate that the threshold voltage $V_{TH}$ has been met or exceeded.

Similarly, as shown in FIGS. 8A and 8B, signals 802 and 804 represent incoming electromagnetic signals that may be received by the architecture 300, such as when the signals 802 and 804 are transmitted by a communication node 102 and received by an anchor node 104. As shown here, the signal 802 uses the third RF frequency $f_3$, and the signal 804 uses the fourth RF frequency $f_4$. Each of the signals 802 and 804 includes a collection of pulses, and the pulses in each of the signals 802 and 804 are separated by a period of time. As shown in FIGS. 8C and 8D, signals 806 and 808 represent example outputs generated by the comparators 606a-606b, where the pulses in the signals 802 and 804 have been converted to square or rectangular pulses in the signals 806 and 808. Again, the signals 806 and 808 here essentially contain "boxcar" pulses, where the leading and trailing transitions in the signals 806 and 808 track the leading and trailing edges of the corresponding pulses in the signals 802 and 804.

As shown in FIGS. 8E and 8F, signals 810 and 812 represent example outputs generated by the edge detectors 608a-608b, where leading edges of the pulses in the signals 806 and 808 are converted into positive spikes and trailing edges of the pulses in the signals 806 and 808 are converted into negative spikes in the signals 810 and 812. The signals 810 and 812 are rectified using the rectifiers 610a-610b, which remove the negative spikes. As shown in FIG. 8G, the combiner 611 combines the rectified signals to produce a combined signal 814, which includes the positive spikes of both signals 810 and 812. Each spike in the signal 814 is generally separated from adjacent spikes by a time $\Delta T$, which is based on the pulse repetition frequencies of the $f_3$ and $f_4$ signals 802 and 804.

As shown in FIG. 8H, a signal 816 represents the voltage stored on the integration capacitor or other integrating circuit of the integrator 612. As can be seen here, the voltage stored on the integrating circuit generally increases for a time period T, where T is typically much larger than $\Delta T$ and varies based on the signals 802 and 804 being processed. Eventually, the charge stored on the integrating circuit of the integrator 612 reaches or exceeds the threshold voltage $V_{TH}$, which causes the comparator 614 to reset the integrating circuit by discharging the integrating circuit. The integrating circuit may then be charged again, and the process may continue any number of times. The counter 616 can count the number of times that the integrating circuit is reset, which is also based on the number of times that the comparator 614 toggles its output high to indicate that the threshold voltage $V_{TH}$ has been met or exceeded.

Although FIGS. 7A through 8H illustrate examples of signals associated with capacitive batch counters 320' and 320", various changes may be made to FIGS. 7A through 8H. For example, the exact forms of the signals shown in FIGS. 7A through 8H are for illustration only and can vary based on various factors, such as the specific signals being received and the specific circuitry used to process the signals.

FIGS. 9 through 12 illustrate example components in capacitive batch counters in accordance with this disclosure. In particular, FIGS. 9 through 12 illustrate example implementations of various components used in the capacitive batch counters 320' and 320" shown in FIGS. 5 and 6. Note that the specific embodiments of the components shown in FIGS. 9 through 12 are for illustration only, and the various components used in the capacitive batch counters 320' and 320" may be designed in any other suitable manner depending on the implementation.

Figure 9:
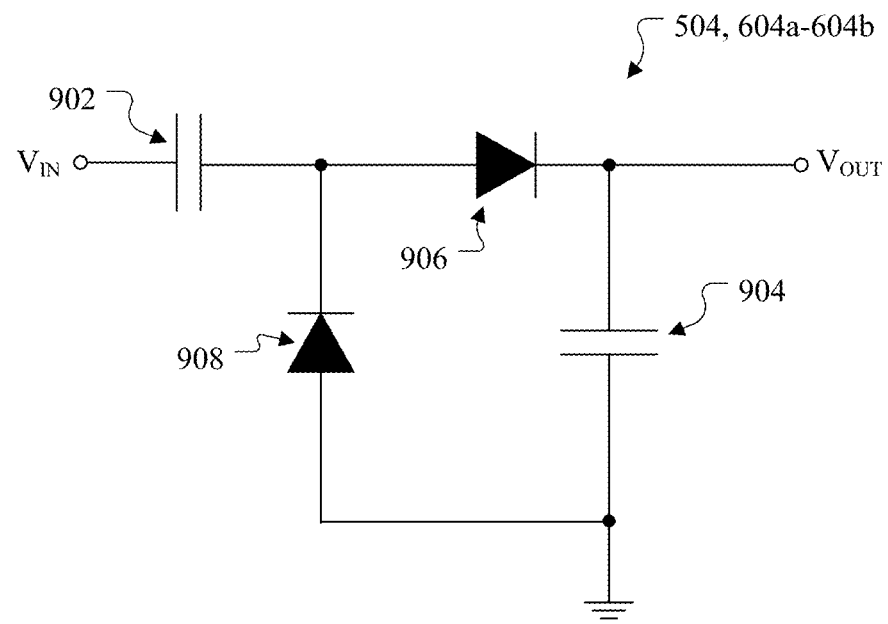
FIGS. 9 through 12 illustrate example components in capacitive batch counters in accordance with this disclosure.

As shown in FIG. 9, an envelope detector 504, 604a-604b may be implemented using two capacitors 902, 904 and two diodes 906, 908. In this example, the capacitor 902 is coupled to receive an input voltage $V_{IN}$ and to store a charge based on the input voltage $V_{IN}$. The input voltage $V_{IN}$ here may represent a voltage from the amplifier 502 or a voltage from a filter 316 or 318. The diode 906 is coupled in series with the capacitor 902 and generates an output voltage $V_{OUT}$. The output voltage $V_{OUT}$ here may represent a voltage provided to the comparator 506, 606a-606b. The capacitor 904 and the diode 908 are coupled in series with each other and are collectively coupled in parallel with the diode 906. The capacitor 904 and the diode 908 are also coupled to ground. During operation, these components 902-908 operate to convert the input voltage $V_{IN}$ (which can include pulses of electromagnetic energy) into an output voltage $V_{OUT}$ that defines the envelope of the input voltage $V_{IN}$. However, other implementations of each envelope detector 504, 604a-604b may be used.

Figure 10:
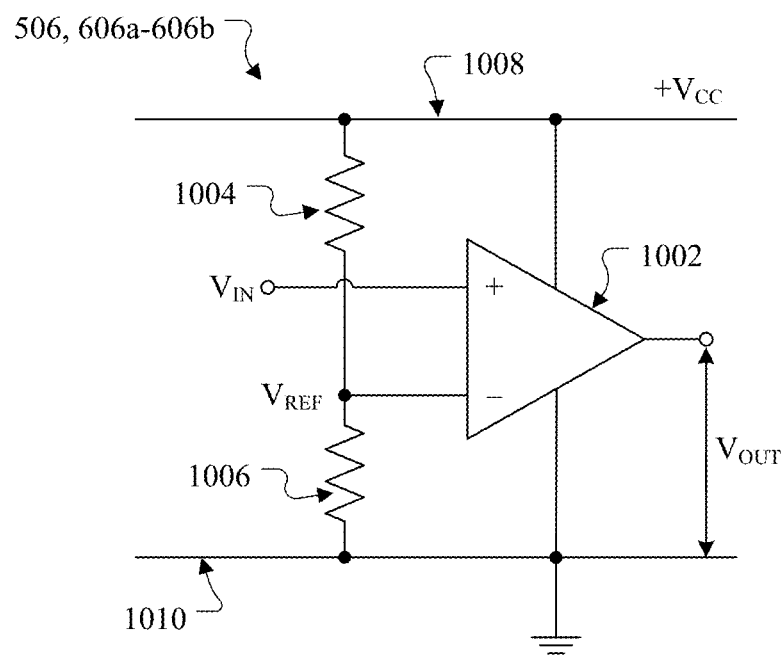

As shown in FIG. 10, the comparator 506, 606a-606b may be implemented using an operational amplifier (op amp) 1002 and a voltage divider formed using two resistors 1004 and 1006. A non-inverting input terminal of the op amp 1002 is coupled to receive an input voltage $V_{IN}$, and an inverting input terminal of the op amp 1002 is coupled to receive a reference voltage $V_{REF}$. The input voltage $V_{IN}$ here may represent a voltage from the envelope detector 504, 604a-604b. The reference voltage $V_{REF}$ is generated between the resistors 1004 and 1006 of the voltage divider. The op amp 1002 and the voltage divider are coupled to a positive rail 1008 and a negative or ground rail 1010. The positive rail 1008 provides a positive supply voltage (denoted $+V_{CC}$) to the op amp 1002 and the voltage divider, and the negative or ground rail 1010 provides a negative or ground voltage to the op amp 1002 and the voltage divider. Any suitable voltages may be used here, and the resistances of the resistors 1004 and 1006 can be selected in order to provide the desired reference voltage $V_{REF}$. An output voltage $V_{OUT}$ of the comparator 506, 606a-606b is generated by an output of the op amp 1002 with reference to the negative or ground voltage. The output voltage $V_{OUT}$ here may represent a voltage provided to the edge detector 508, 608a-608b. The output voltage $V_{OUT}$ may be high (such as $+V_{CC}$) when the input voltage $V_{IN}$ meets or exceeds the reference voltage $V_{REF}$ and low (such as 0 volts) when the input voltage $V_{IN}$ does not meet or exceed the reference voltage $V_{REF}$. However, other implementations of each comparator 506, 606a-606b may be used.

Figure 11:
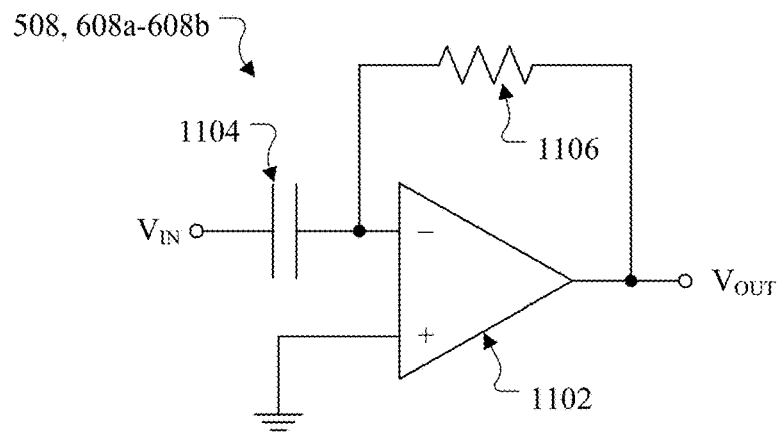

As shown in FIG. 11, the edge detector 508, 608a-608b may be implemented using an op amp 1102, a capacitor 1104, and a resistor 1106. A non-inverting input terminal of the op amp 1102 is coupled to ground, and an inverting input terminal of the op amp 1102 is coupled to the capacitor 1104. The capacitor 1104 is coupled to receive an input voltage $V_{IN}$ and to store a charge based on the input voltage $V_{IN}$. The input voltage $V_{IN}$ here may represent a voltage from the comparator 506, 606a-606b. The resistor 1106 represents a feedback resistor and is coupled to an output terminal and the inverting input terminal of the op amp 1102. During operation, these components 1102-1106 operate to convert pulses in the input voltage $V_{IN}$ into spikes in the output voltage $V_{OUT}$, where the spikes identify locations of the edges of the pulses in the input voltage $V_{IN}$. The output voltage $V_{OUT}$ here may represent a voltage provided to the rectifier 510, 610a-610b. Note that this embodiment of the edge detector 508, 608a-608b takes the form of a differentiator. However, other active or passive implementations of the edge detectors 508, 608a-608b may be used, such as when the edge detectors 508, 608a-608b are implemented using high-pass filters or using edge detectors that generate pulses when edges are detected.

Figure 12:
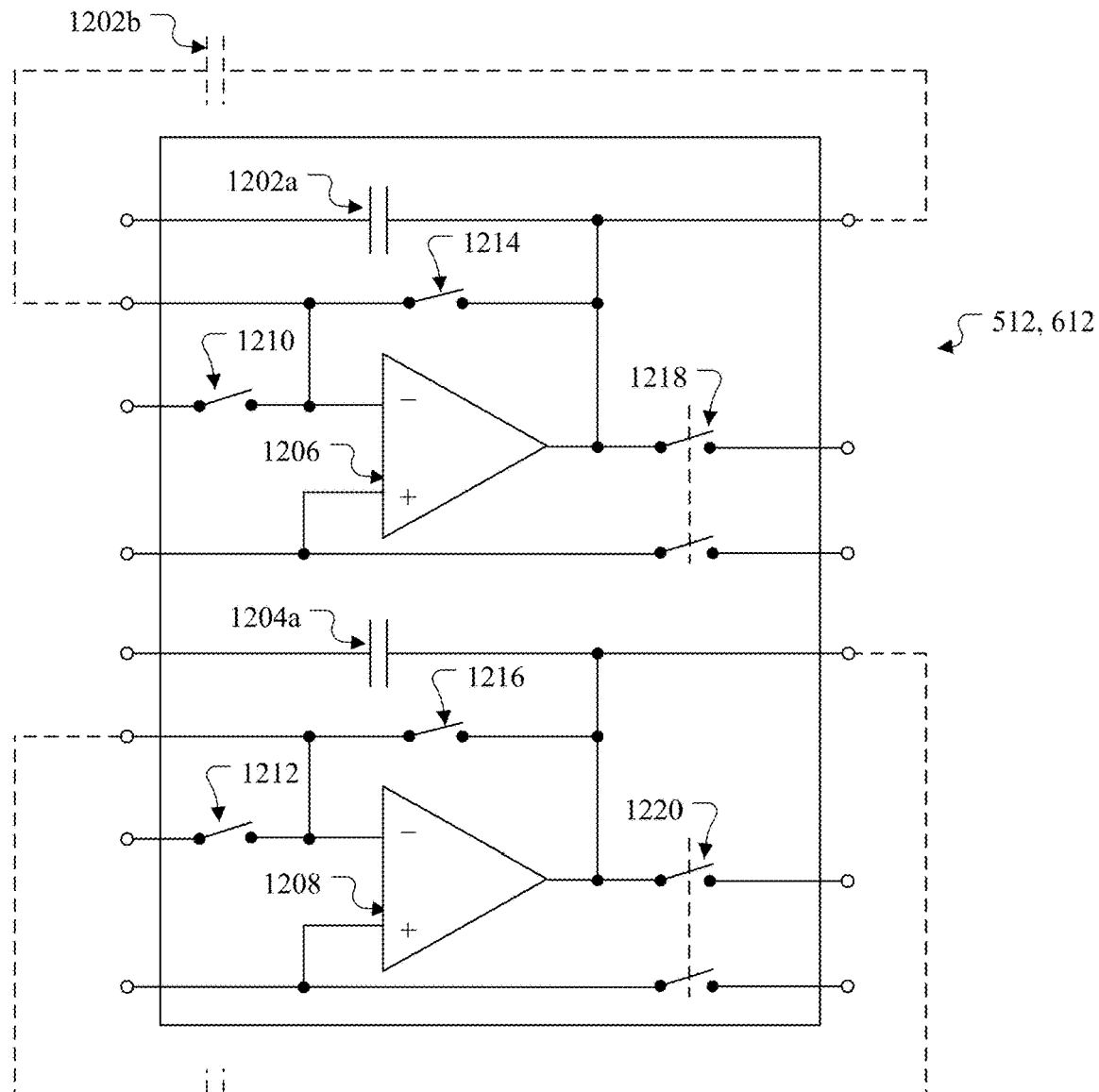

As shown in FIG. 12, the integrator 512, 612 may be implemented using a dual-switched integrator, although a single integrator may be used to implement the integrator 512 and one or two integrators may be used to implement the integrator 612. Here, the dual-switched integrator includes two internal integration capacitors 1202a and 1204a (which represent integrating circuits), each of which may be trickle-charged or otherwise charged based on pulses received in one or more incoming electromagnetic signals. While these two internal integration capacitors 1202a and 1204a are located on-chip, one or more external integration capacitors 1202b and 1204b may be used here. Each internal integration capacitor 1202a and 1204a (or each external integration capacitor 1202b and 1204b) is respectively associated with an op amp 1206 and 1208. Each op amp 1206 and 1208 is respectively associated with a hold switch 1210 and 1212, which can be triggered to hold the output of the associated op amp 1206 and 1208 substantially at its current level. Each op amp 1206 and 1208 is also respectively associated with a reset switch 1214 and 1216, which can be triggered to discharge the associated integration capacitor. In addition, each op amp 1206 and 1208 is respectively associated with a pair of select switches 1218 and 1220, which can be controlled to allow multiplexing of different outputs from different ones of the op amps 1206 and 1208 over common output signal lines. The dual-switched integrator here represents the ACF2101 low noise, dual-switched integrator from TEXAS INSTRUMENTS. However, other implementations of each integrator 512, 612 may be used.

Although FIGS. 9 through 12 illustrate examples of components in capacitive batch counters 320' and 320", various changes may be made to FIGS. 9 through 12. For example, various components shown in FIGS. 9 through 12 may be combined, further subdivided, rearranged, replicated, or omitted and additional components can be added according to particular needs. Also, each of the components shown in FIGS. 9 through 12 may be implemented using any suitable circuitry that performs the recited function or functions of that component.

Figure 13:
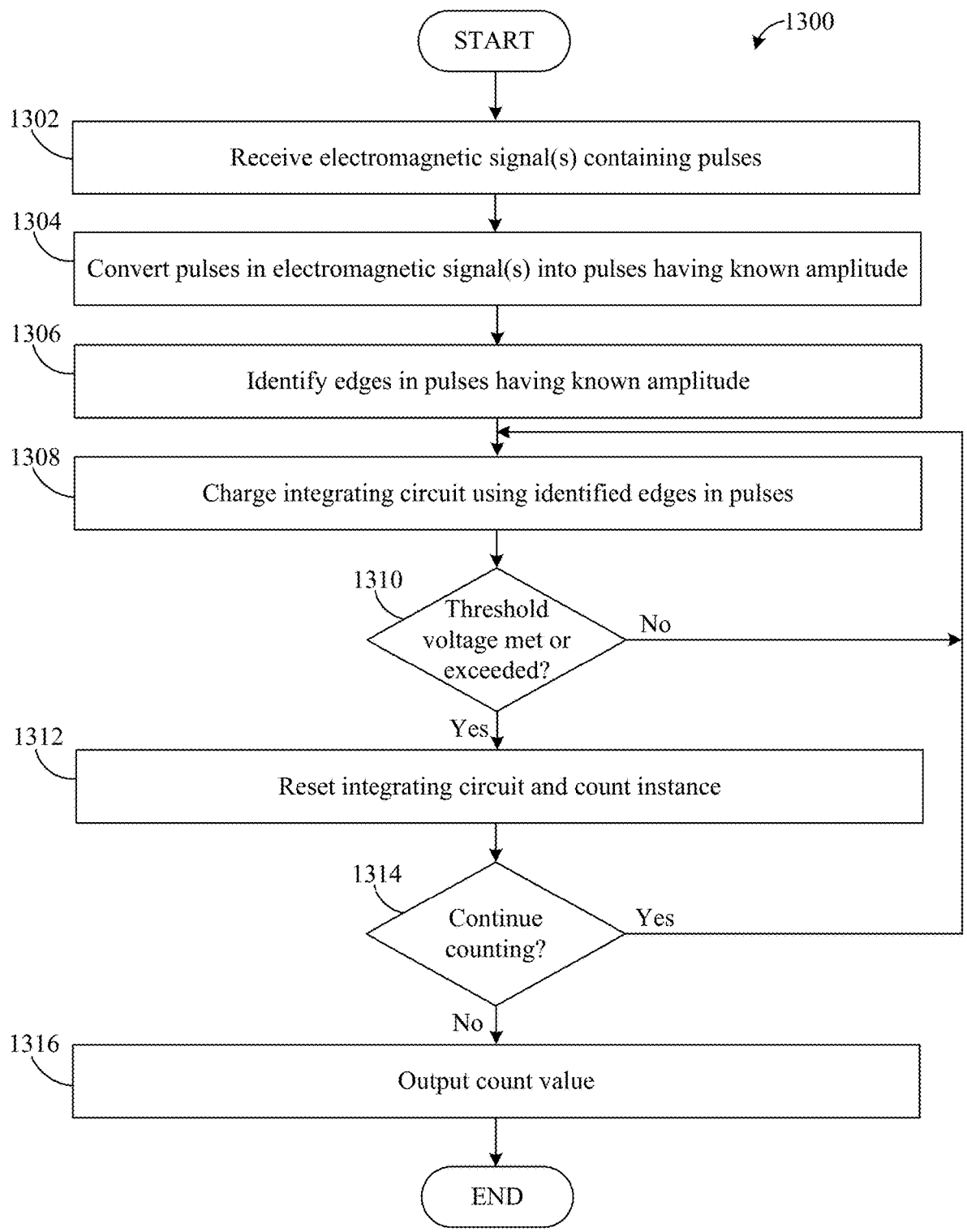
FIG. 13 illustrates an example method for capacitive batch counting in accordance with this disclosure.

FIG. 13 illustrates an example method 1300 for capacitive batch counting in accordance with this disclosure. For ease of explanation, the method 1300 may be described as involving the anchor node 104 of FIG. 1 using the architecture 300 of FIG. 3. However, the method 1300 may involve the use of any other suitable nodes and architectures and in any other suitable systems.

As shown in FIG. 13, one or more electromagnetic signals containing pulses are received at step 1302. This may include, for example, the anchor node 104 receiving multiple electromagnetic signals 204 from a communication node 102, such as during a multi-one-way time-of-flight measurement process. The pulses in the one or more signals are converted into pulses having known amplitude at step 1304. This may include, for example, the envelope detector(s) 504, 604a-604b generating one or more signals defining the envelope(s) of the pulses in the received electromagnetic signals 204. This may also include the comparator(s) 506, 606a-606b comparing the envelope(s) of the pulses in the received electromagnetic signals 204 to a threshold voltage $V_{REF}$ in order to produce converted pulses having known amplitude. At least some of the edges of the converted pulses having known amplitude are identified at step 1306. This may include, for example, the edge detector(s) 508, 608a-608b generating spikes associated with the leading and/or trailing edges of the converted pulses and the edge detector(s) 508, 608a-608b or rectifier(s) 510, 610a-610b removing a subset of the spikes (such as the spikes having negative voltages). This may also optionally include combining pulses associated with multiple signals using the combiner 611.

An integration capacitor or other integrating circuit is charged based on the identified edges of the converted pulses having known amplitude at step 1308. This may include, for example, the integrator 512, 612 charging one or more integration capacitors 1202a-1202b, 1204a-1204b using electrical currents associated with the spikes. A determination is made whether a threshold voltage is met or exceeded at step 1310. This may include, for example, the comparator 514, 614 comparing the charge stored on the integrating circuit to the threshold voltage $V_{TH}$. If the threshold voltage is not met or exceeded, the process can return to step 1308 to continue the integration process by charging the integrating circuit based on additional edges of the converted pulses.

Otherwise, the threshold voltage is met or exceeded at step 1310, and the integrating circuit is reset and the instance of the threshold voltage being satisfied is counted at step 1312. This may include, for example, the comparator 514, 614 toggling its output high in response to detecting that the threshold voltage $V_{TH}$ has been met or exceeded. This can close a reset switch 1214 or 1216 and reset the voltage stored on the integration capacitor, which causes the comparator 514, 614 to toggle its output back to low. This can also cause the counter 516, 616 to count one instance of the integration capacitor being reset. A determination is made whether to continue counting at step 1314. If so, the process can return to step 1308 to repeat the integration process by charging the integrating circuit again. Otherwise, the count value of the counter can be output at step 1316. This may include, for example, the counter 516, 616 providing its count value 518, 618 to one or more intended destinations.

Although FIG. 13 illustrates one example of a method 1300 for capacitive batch counting, various changes may be made to FIG. 13. For example, while shown as a series of steps, various steps in FIG. 13 may overlap, occur in parallel, occur in a different order, occur any number of times, or be omitted. As a particular example, the decision to stop counting (and the output of the count value) may occur at any suitable time after counting begins and need not occur only after the integrating circuit is reset.

Figure 14:
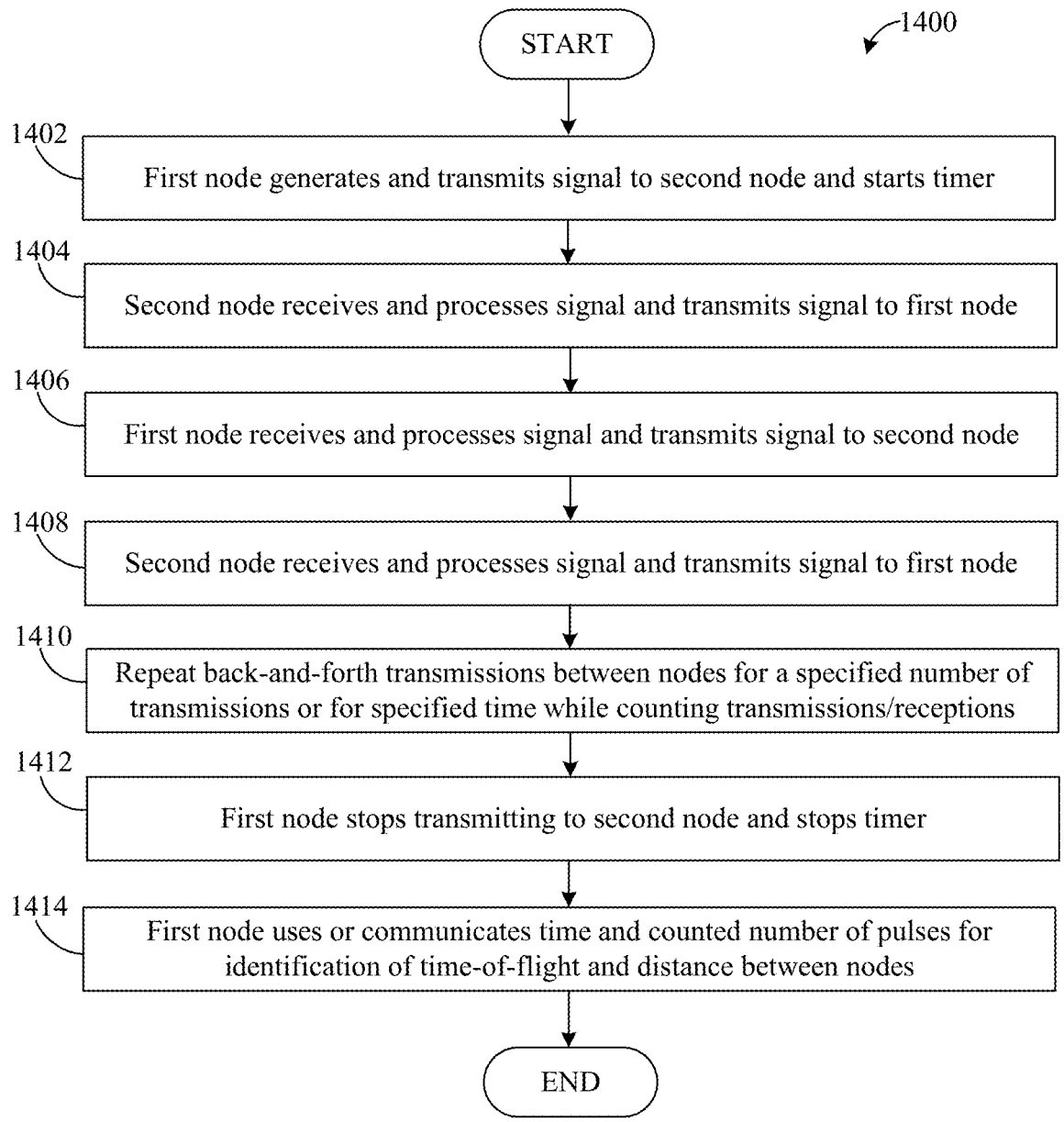
FIG. 14 illustrates an example method for multi-one-way time-of-flight localization using capacitive batch counting in accordance with this disclosure.

FIG. 14 illustrates an example method 1400 for multi-one-way time-of-flight localization using capacitive batch counting in accordance with this disclosure. For ease of explanation, the method 1400 may be described as involving the communication and anchor nodes 102, 104 of FIG. 1 using the architecture 300 of FIG. 3 to support the communication scheme shown in FIG. 2. However, the method 1400 may involve the use of any other suitable nodes, architectures, and communication schemes and in any other suitable systems.

As shown in FIG. 14, a first node generates and transmits an electromagnetic signal to a second node and starts a timer at step 1402. This may include, for example, the anchor node 104 generating an electromagnetic signal 202 (such as an RF signal) at the first RF frequency $f_1$ using the RF frequency generator 306 of the anchor node 104. This may also include the anchor node 104 starting a timer 304 when the first electromagnetic signal 202 is transmitted. A second node receives and processes the electromagnetic signal from the first node and generates and transmits an electromagnetic signal at step 1404. This may include, for example, the communication node 102 generating an electromagnetic signal 204 (such as an RF signal) at the third RF frequency $f_3$ using the RF frequency generator 306 of the communication node 102.

The first node receives and processes the electromagnetic signal from the second node and generates and transmits another electromagnetic signal to the second node at step 1406. This may include, for example, the anchor node 104 generating an electromagnetic signal 202 (such as an RF signal) at the second RF frequency $f_2$ using the RF frequency multiplier 308 of the anchor node 104. The second node receives and processes the electromagnetic signal from the first node and generates and transmits another electromagnetic signal at step 1408. This may include, for example, the communication node 102 generating an electromagnetic signal 204 (such as an RF signal) at the fourth RF frequency $f_4$ using the RF frequency multiplier 308 of the communication node 102.

These back-and-forth communications of the electromagnetic signals are repeated at step 1410, which generally involves repeating the transmissions/receptions of the electromagnetic signals 202, 204. This also includes the anchor node 104 (or the communication node 102) using the capacitive batch counter 320, 320', 320" to estimate the number of pulses (electromagnetic signals) received from the other node. In some embodiments, this repeats until a specific number of electromagnetic signals have been communicated between the nodes 102, 104 or until a specified amount of time has elapsed. At that point, the first node stops the timer at step 1412. This may include, for example, the anchor node 104 stopping the timer 304 and ceasing transmission of the electromagnetic signals 202, which causes the communication node 102 to cease transmission of the electromagnetic signals 204.

The first node uses the measured time and the counted number of pulses to calculate a time-of-flight (which can be used to identify a distance to the second node), or the first node transmits the measured time and pulse count to another component that uses the measured time and pulse count to calculate a time-of-flight (which can be used to identify a distance to the second node) at step 1414. This may include, for example, the anchor node 104 dividing the measured or known amount of time during which the electromagnetic signals were being transmitted by the estimated number of electromagnetic signals received by the anchor node 104. This may be used to identify the one-way time-of-flight between the nodes 102, 104. The measured time can also be pre-processed, such as by subtracting the estimated processing time of the second node (for receiving and detecting the electromagnetic signals 202 and transmitting the electromagnetic signals 204) and the estimated processing time of the first node (for receiving and detecting the electromagnetic signals 204 and transmitting the electromagnetic signals 202). The estimated time-of-flight can be used to localize the second node with respect to the first node.

Although FIG. 14 illustrates one example of a method 1400 for multi-one-way time-of-flight localization using capacitive batch counting, various changes may be made to FIG. 14. For example, while shown as a series of steps, various steps in FIG. 14 may overlap, occur in parallel, occur in a different order, occur any number of times, or be omitted. Also, the process shown in FIG. 14 may occur repeatedly so that the results can be averaged, such as by identifying and averaging multiple one-way times-of-flight or distances. In addition, the determined time-of-flight or distance may be used in any suitable manner.

Figure 15:
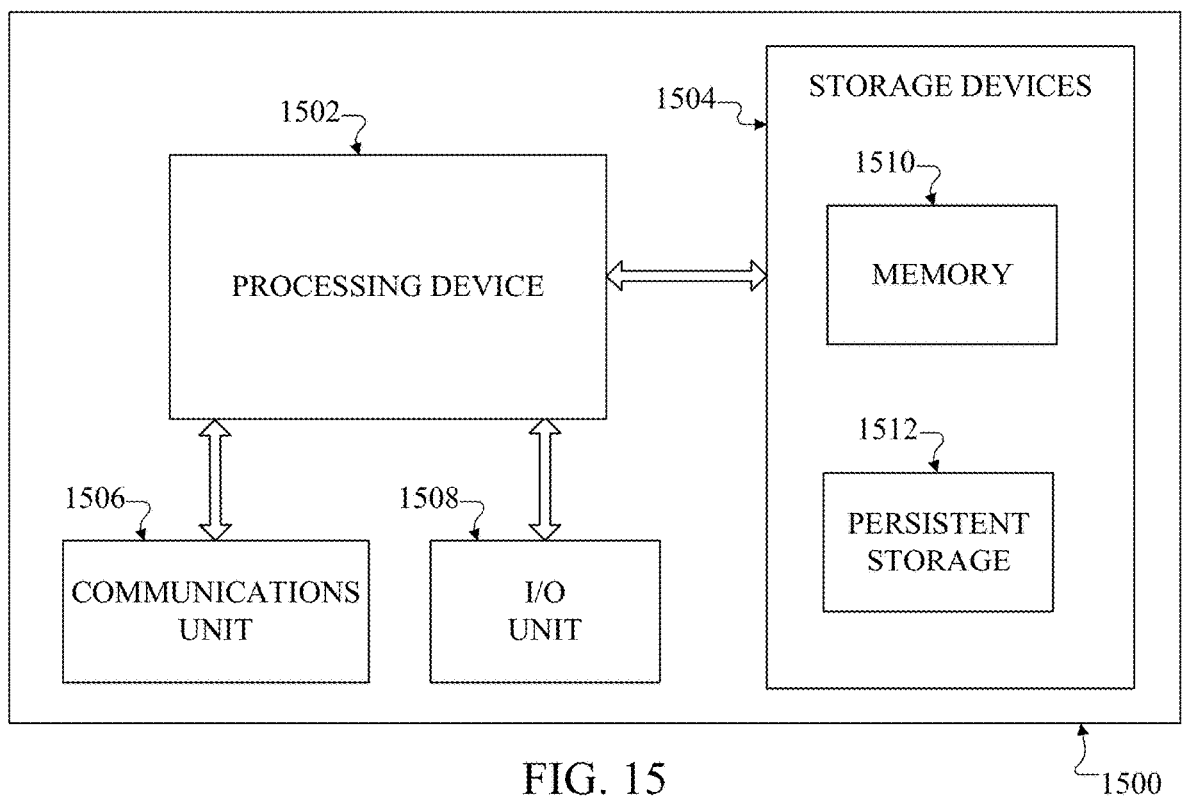
FIG. 15 illustrates an example device supporting capacitive batch counting and optionally multi-one-way time-of-flight localization using capacitive batch counting in accordance with this disclosure.

FIG. 15 illustrates an example device 1500 supporting capacitive batch counting and optionally multi-one-way time-of-flight localization using capacitive batch counting in accordance with this disclosure. For example, the device 1500 shown in FIG. 15 may represent a portion of a larger device or system that uses count values from one or more capacitive batch counters 320, 320', 320" to perform one or more operations. As a particular example, the device 1500 shown in FIG. 15 may be used in an anchor node 104 or other device that performs multi-one-way time-of-flight localization. However, capacitive batch counting may be used in or with any other suitable device or system.

As shown in FIG. 15, the device 1500 denotes a computing device or system that includes at least one processing device 1502, at least one storage device 1504, at least one communications unit 1506, and at least one input/output (I/O) unit 1508. The processing device 1502 may execute instructions that can be loaded into a memory 1510. The processing device 1502 includes any suitable number(s) and type(s) of processors or other processing devices in any suitable arrangement. Example types of processing devices 1502 include one or more microprocessors, microcontrollers, digital signal processors (DSPs), application specific integrated circuits (ASICs), field programmable gate arrays (FPGAs), or discrete circuitry.

The memory 1510 and a persistent storage 1512 are examples of storage devices 1504, which represent any structure(s) capable of storing and facilitating retrieval of information (such as data, program code, and/or other suitable information on a temporary or permanent basis). The memory 1510 may represent a random access memory or any other suitable volatile or non-volatile storage device(s). The persistent storage 1512 may contain one or more components or devices supporting longer-term storage of data, such as a read only memory, hard drive, Flash memory, or optical disc.

The communications unit 1506 supports communications with other systems or devices. For example, the communications unit 1506 can include a network interface card or a wireless transceiver facilitating communications over a wired or wireless network. The communications unit 1506 may support communications through any suitable physical or wireless communication link(s).

The I/O unit 1508 allows for input and output of data. For example, the I/O unit 1508 may provide a connection for user input through a keyboard, mouse, keypad, touchscreen, or other suitable input device. The I/O unit 1508 may also send output to a display or other suitable output device. Note, however, that the I/O unit 1508 may be omitted if the device 1500 does not require local I/O, such as when the device 1500 represents a server or other device that can be accessed remotely.

In some embodiments, instructions that are executed by the processing device 1502 may include instructions that use count values 518, 618 generated by one or more capacitive batch counters 320, 320', 320". As a particular example, instructions that are executed by the processing device 1502 may include instructions that cause the processing device 1502 to perform multi-one-way time-of-flight localization, which can involve using an estimate of the number of pulses received during a predefined or other time period to estimate the distance between nodes.

Although FIG. 15 illustrates one example of a device 1500 supporting capacitive batch counting and optionally multi-one-way time-of-flight localization using capacitive batch counting, various changes may be made to FIG. 15. For example, computing and communication devices and systems come in a wide variety of configurations, and FIG. 15 does not limit this disclosure to any particular computing or communication device or system.

The following describes example embodiments of this disclosure that implement or relate to capacitive batch counting to support one-way time-of-flight or other operations. However, other embodiments may be used in accordance with the teachings of this disclosure.

In a first embodiment, a method includes receiving electromagnetic signals containing pulses. The method also includes converting the pulses contained in the electromagnetic signals into an electrical signal that identifies at least some of leading or trailing edges of the pulses. The method further includes repeatedly (i) accumulating the electrical signal to generate a voltage using an integrating circuit and (ii) resetting the integrating circuit in response to the voltage of the integrating circuit meeting or exceeding a threshold voltage. In addition, the method includes providing a count value identifying a number of times that the voltage of the integrating circuit meets or exceeds the threshold voltage. Each time the voltage of the integrating circuit meets or exceeds the threshold voltage is representative of a specific number of pulses received in the electromagnetic signals.

Any single one or any suitable combination of the following features may be used with the first embodiment. The method may further include generating a digital output based on the voltage of the integrating circuit, the digital output may indicate whether the voltage of the integrating circuit meets or exceeds the threshold voltage, and the count value may be based on the digital output. Converting the pulses contained in the electromagnetic signals into the electrical signal may include identifying envelopes of the pulses contained in the electromagnetic signals, comparing the envelopes to a reference voltage in order to generate an initial digital output having high and low values, and detecting the leading or trailing edges of the pulses using the initial digital output. Detecting the leading or trailing edges of the pulses using the initial digital output may include generating an output having positive and negative spikes that identify the leading and trailing edges of the pulses. Converting the pulses contained in the electromagnetic signals into the electrical signal may further include blocking the positive or negative spikes. The electromagnetic signals may include first electromagnetic signals, the pulses may include first pulses, and the electrical signal may include a first electrical signal. The method may further include receiving second electromagnetic signals containing second pulses and converting the second pulses contained in the second electromagnetic signals into a second electrical signal that identifies at least some of leading or trailing edges of the second pulses. The integration circuit may be repeatedly used to accumulate at least one of the first and second electrical signals. The electromagnetic signals may include incoming electromagnetic signals, and the method may further include transmitting outgoing electromagnetic signals. The outgoing electromagnetic signals may contain pulses at first and second RF frequencies, and the incoming electromagnetic signals may contain pulses at third and fourth RF frequencies. The outgoing and incoming electromagnetic signals may be interleaved such that a pulse at the first RF frequency is transmitted, a pulse at the third RF frequency is received, a pulse at the second RF frequency is transmitted, and a pulse at the fourth RF frequency is received in a repeating pattern. The pulses contained in the electromagnetic signals may have varying amplitudes, and converting the pulses contained in the electromagnetic signals into the electrical signal may include generating pulses having a known amplitude in the electrical signal.

In a second embodiment, an apparatus includes a front-end configured to convert pulses contained in received electromagnetic signals into an electrical signal that identifies at least some of leading or trailing edges of the pulses. The apparatus also includes an integrating circuit configured to repeatedly (i) accumulate the electrical signal to generate a voltage and (ii) be reset in response to the voltage of the integrating circuit meeting or exceeding a threshold voltage. The apparatus further includes a counter configured to generate a count value identifying a number of times that the voltage of the integrating circuit meets or exceeds the threshold voltage. Each time the voltage of the integrating circuit meets or exceeds the threshold voltage is representative of a specific number of pulses received in the electromagnetic signals.

Any single one or any suitable combination of the following features may be used with the second embodiment. The apparatus may further include a comparator configured to generate a digital output based on the voltage of the integrating circuit, the digital output may indicate whether the voltage of the integrating circuit meets or exceeds the threshold voltage, and the count value may be based on the digital output. The front-end may include an envelope detector configured to identify envelopes of the pulses contained in the electromagnetic signals, a second comparator configured to compare the envelopes to a reference voltage in order to generate an initial digital output having high and low values, and an edge detector configured to identify the leading or trailing edges of the pulses using the initial digital output. The edge detector may be configured to generate an output having positive and negative spikes that identify the leading and trailing edges of the pulses. The front-end may further include a rectifier configured to block the positive or negative spikes. The electrical signal may include a first electrical signal, and the apparatus may further include a second front-end configured to convert second pulses contained in second received electromagnetic signals into a second electrical signal that identifies at least some of leading or trailing edges of the second pulses. The integration circuit may be configured to repeatedly accumulate at least one of the first and second electrical signals. The electromagnetic signals may include incoming electromagnetic signals, and the apparatus may further include at least one signal source configured to generate outgoing electromagnetic signals. The outgoing electromagnetic signals may contain pulses at first and second RF frequencies, and the incoming electromagnetic signals may contain pulses at third and fourth RF frequencies. The apparatus may be configured to use a repeating pattern in which the outgoing and incoming electromagnetic signals are interleaved such that a pulse at the first RF frequency is transmitted, a pulse at the third RF frequency is received, a pulse at the second RF frequency is transmitted, and a pulse at the fourth RF frequency is received. The pulses contained in the electromagnetic signals may have varying amplitudes, and the front-end may be configured to generate pulses having a known amplitude in the electrical signal.

In a third embodiment, an apparatus includes a first node configured to transmit first electromagnetic signals to a second node and receive second electromagnetic signals from the second node. The first node includes a front-end configured to convert pulses contained in the second electromagnetic signals into an electrical signal that identifies at least some of leading or trailing edges of the pulses. The first node also includes an integrating circuit configured to repeatedly (i) accumulate the electrical signal to generate a voltage and (ii) be reset in response to the voltage of the integrating circuit meeting or exceeding a threshold voltage. The first node further includes a counter configured to generate a count value identifying a number of times that the voltage of the integrating circuit meets or exceeds the threshold voltage. Each time the voltage of the integrating circuit meets or exceeds the threshold voltage is representative of a specific number of pulses received in the electromagnetic signals.

Any single one or any suitable combination of the following features may be used with the third embodiment. The first node may further include a comparator configured to generate a digital output based on the voltage of the integrating circuit, the digital output may indicate whether the voltage of the integrating circuit meets or exceeds the threshold voltage, and the count value may be based on the digital output. The first node may further include at least one processing device configured to identify, based on the count value generated as a result of repeated transmissions and receptions of the first and second electromagnetic signals, a time-of-flight associated with a travel time for one of the electromagnetic signals to travel between the first and second nodes, and the time-of-flight may be indicative of a distance between the nodes. The front-end may include an envelope detector configured to identify envelopes of the pulses contained in the second electromagnetic signals, a second comparator configured to compare the envelopes to a reference voltage in order to generate an initial digital output having high and low values, and an edge detector configured to identify the leading or trailing edges of the pulses using the initial digital output. The second electromagnetic signals may contain pulses at different RF frequencies, and the front-end may be configured to receive the second electromagnetic signals at one of the RF frequencies. The first node may further include a second front-end configured to convert second pulses contained in the second electromagnetic signals at another of the RF frequencies into a second electrical signal. The integration circuit may be configured to repeatedly accumulate at least one of the first and second electrical signals. The first electromagnetic signals may contain pulses at first and second RF frequencies, and the second electromagnetic signals may contain pulses at third and fourth RF frequencies. The first node may be configured to use a repeating pattern in which the first and second electromagnetic signals are interleaved such that a pulse at the first RF frequency is transmitted, a pulse at the third RF frequency is received, a pulse at the second RF frequency is transmitted, and a pulse at the fourth RF frequency is received.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C. The phrase "RF frequency" refers to a radio frequency (RF) oscillation rate of an electromagnetic signal in the frequency range from around 20 kHz to around 300 GHz. The term "frequency" not directly preceded by "RF" refers to a temporal rate of occurrence of some event, such as when "pulse repetition frequency" refers to the rate at which a repeating pulse occurs.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the scope of this disclosure, as defined by the following claims.

What is claimed is:

1. A method comprising:
   receiving electromagnetic signals containing pulses;
   converting the pulses contained in the electromagnetic signals into an electrical signal that identifies at least some of leading or trailing edges of the pulses;
   repeatedly (i) accumulating the electrical signal to generate a voltage using an integrating circuit and (ii) resetting the integrating circuit in response to the voltage of the integrating circuit meeting or exceeding a threshold voltage; and
   providing a count value identifying a number of times that the voltage of the integrating circuit meets or exceeds the threshold voltage;
   wherein each time the voltage of the integrating circuit meets or exceeds the threshold voltage is representative of a specific number of pulses received in the electromagnetic signals.

2. The method of claim 1, further comprising:
generating a digital output based on the voltage of the integrating circuit, the digital output indicating whether the voltage of the integrating circuit meets or exceeds the threshold voltage;
wherein the count value is based on the digital output.

3. The method of claim 1, wherein converting the pulses contained in the electromagnetic signals into the electrical signal comprises;
identifying envelopes of the pulses contained in the electromagnetic signals;
comparing the envelopes to a reference voltage in order to generate an initial digital output having high and low values; and
detecting the leading or trailing edges of the pulses using the initial digital output.

4. The method of claim 3, wherein:
detecting the leading or trailing edges of the pulses using the initial digital output comprises generating an output having positive and negative spikes that identify the leading and trailing edges of the pulses; and
converting the pulses contained in the electromagnetic signals into the electrical signal further comprises blocking the positive or negative spikes.

5. The method of claim 1, wherein:
the electromagnetic signals comprise first electromagnetic signals;
the pulses comprise first pulses;
the electrical signal comprises a first electrical signal,
the method further comprises:
receiving second electromagnetic signals containing second pulses; and
converting the second pulses contained in the second electromagnetic signals into a second electrical signal that identifies at least some of leading or trailing edges of the second pulses; and
the integration circuit is repeatedly used to accumulate at least one of the first and second electrical signals.

6. The method of claim 1, wherein:
the electromagnetic signals comprise incoming electromagnetic signals;
the method further comprises transmitting outgoing electromagnetic signals;
the outgoing electromagnetic signals contain pulses at first and second RF frequencies;
the incoming electromagnetic signals contain pulses at third and fourth RF frequencies; and
the outgoing and incoming electromagnetic signals are interleaved such that a pulse at the first RF frequency is transmitted, a pulse at the third RF frequency is received, a pulse at the second RF frequency is transmitted, and a pulse at the fourth RF frequency is received in a repeating pattern.

7. The method of claim 1, wherein:
the pulses contained in the electromagnetic signals have varying amplitudes; and
converting the pulses contained in the electromagnetic signals into the electrical signal comprises generating pulses having a known amplitude in the electrical signal.

8. An apparatus comprising:
a front-end configured to convert pulses contained in received electromagnetic signals into an electrical signal that identifies at least some of leading or trailing edges of the pulses;
an integrating circuit configured to repeatedly (i) accumulate the electrical signal to generate a voltage and (ii) be reset in response to the voltage of the integrating circuit meeting or exceeding a threshold voltage; and
a counter configured to generate a count value identifying a number of times that the voltage of the integrating circuit meets or exceeds the threshold voltage;
wherein each time the voltage of the integrating circuit meets or exceeds the threshold voltage is representative of a specific number of pulses received in the electromagnetic signals.

9. The apparatus of claim 8, further comprising:
a comparator configured to generate a digital output based on the voltage of the integrating circuit, the digital output indicating whether the voltage of the integrating circuit meets or exceeds the threshold voltage;
wherein the count value is based on the digital output.

10. The apparatus of claim 8, wherein the front-end comprises:
an envelope detector configured to identify envelopes of the pulses contained in the electromagnetic signals;
a comparator configured to compare the envelopes to a reference voltage in order to generate an initial digital output having high and low values; and
an edge detector configured to identify the leading or trailing edges of the pulses using the initial digital output.

11. The apparatus of claim 10, wherein:
the edge detector is configured to generate an output having positive and negative spikes that identify the leading and trailing edges of the pulses; and
the front-end further comprises a rectifier configured to block the positive or negative spikes.

12. The apparatus of claim 8, wherein:
the electrical signal comprises a first electrical signal;
the apparatus further comprises a second front-end configured to convert second pulses contained in second received electromagnetic signals into a second electrical signal that identifies at least some of leading or trailing edges of the second pulses; and
the integration circuit is configured to repeatedly accumulate at least one of the first and second electrical signals.

13. The apparatus of claim 8, wherein:
the electromagnetic signals comprise incoming electromagnetic signals;
the apparatus further comprises at least one signal source configured to generate outgoing electromagnetic signals, the outgoing electromagnetic signals containing pulses at first and second RF frequencies;
the incoming electromagnetic signals contain pulses at third and fourth RF frequencies; and
the apparatus is configured to use a repeating pattern in which the outgoing and incoming electromagnetic signals are interleaved such that a pulse at the first RF frequency is transmitted, a pulse at the third RF frequency is received, a pulse at the second RF frequency is transmitted, and a pulse at the fourth RF frequency is received.

14. The apparatus of claim 8, wherein:
the pulses contained in the electromagnetic signals have varying amplitudes; and
the front-end is configured to generate pulses having a known amplitude in the electrical signal.

15. An apparatus comprising:
a first node configured to transmit first electromagnetic signals to a second node and receive second electromagnetic signals from the second node;

wherein the first node comprises:
- a front-end configured to convert pulses contained in the second electromagnetic signals into an electrical signal that identifies at least some of leading or trailing edges of the pulses;
- an integrating circuit configured to repeatedly (i) accumulate the electrical signal to generate a voltage and (ii) be reset in response to the voltage of the integrating circuit meeting or exceeding a threshold voltage; and
- a counter configured to generate a count value identifying a number of times that the voltage of the integrating circuit meets or exceeds the threshold voltage, wherein each time the voltage of the integrating circuit meets or exceeds the threshold voltage is representative of a specific number of pulses received in the electromagnetic signals.

16. The apparatus of claim 15, wherein:

the first node further comprises a comparator configured to generate a digital output based on the voltage of the integrating circuit, the digital output indicating whether the voltage of the integrating circuit meets or exceeds the threshold voltage; and the count value is based on the digital output.

17. The apparatus of claim 15, wherein the first node further comprises at least one processing device configured to identify, based on the count value generated as a result of repeated transmissions and receptions of the first and second electromagnetic signals, a time-of-flight associated with a travel time for one of the electromagnetic signals to travel between the first and second nodes, the time-of-flight indicative of a distance between the nodes.

18. The apparatus of claim 15, wherein the front-end comprises:
- an envelope detector configured to identify envelopes of the pulses contained in the second electromagnetic signals;
- a comparator configured to compare the envelopes to a reference voltage in order to generate an initial digital output having high and low values; and
- an edge detector configured to identify the leading or trailing edges of the pulses using the initial digital output.

19. The apparatus of claim 15, wherein:

the second electromagnetic signals contain pulses at different RF frequencies;

the front-end is configured to receive the second electromagnetic signals at one of the RF frequencies;

the first node further comprises a second front-end configured to convert second pulses contained in the second electromagnetic signals at another of the RF frequencies into a second electrical signal; and the integration circuit is configured to repeatedly accumulate at least one of the first and second electrical signals.

20. The apparatus of claim 15, wherein:

the first electromagnetic signals contain pulses at first and second RF frequencies;

the second electromagnetic signals contain pulses at third and fourth RF frequencies; and the first node is configured to use a repeating pattern in which the first and second electromagnetic signals are interleaved such that a pulse at the first RF frequency is transmitted, a pulse at the third RF frequency is received, a pulse at the second RF frequency is transmitted, and a pulse at the fourth RF frequency is received.

* * * * *